(12) United States Patent
Horita et al.

(10) Patent No.: US 6,399,985 B2
(45) Date of Patent: Jun. 4, 2002

(54) SEMICONDUCTOR DEVICE

(75) Inventors: Katsuyuki Horita; Takashi Kuroi; Yoshinori Okumura, all of Tokyo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/750,759

(22) Filed: Jan. 2, 2001

(30) Foreign Application Priority Data

Jul. 13, 2000 (JP) ........................................ 2000-212537

(51) Int. Cl.[7] ............................................... H01L 29/76
(52) U.S. Cl. ........................ 257/330; 257/374; 438/259
(58) Field of Search ................................. 257/374, 244, 257/241, 285, 330, 200, 335; 438/259, 270, 271, 589

(56) References Cited

FOREIGN PATENT DOCUMENTS

JP         5-299497        11/1993

Primary Examiner—David Nelms
Assistant Examiner—Andy Huynh
(74) Attorney, Agent, or Firm—Oblon, Spivak, McClelland, Maier & Neustadt, P.C.

(57) ABSTRACT

Provided are a semiconductor device that can obtain more output current without increasing the occupied area of a MOS transistor, and a method for manufacturing the same. MOS transistors (M11, M12) are electrically isolated by a trench isolation oxide film (21). The MOS transistor (M11) has a groove portion (GP) in which the width of the top is 20 nm to 80 nm and the depth is 50 nm to 150 nm. The groove portion (GP) is disposed at the boundary part between a trench isolation insulating film (22) and an active region (AR1) so as to surround the active region (AR1). A gate electrode (31A) is not only disposed above the active region (AR1) but also buried in the groove (GP) with a gate oxide film (30) interposed therebetween. Similarly, in the MOS transistor (M12), a groove portion (GP) is disposed at the boundary part between the trench isolation insulating film (21) and an active region (AR2) so as to surround the active region (AR2), and a gate electrode (32A) is also buried in the groove (GP) with the gate oxide film (30) interposed therebetween.

8 Claims, 19 Drawing Sheets

SEMICONDUCTOR DEVICE

BACKGROUND OF THE INVENTION

1. Field of the Invention

The present invention relates generally to a semiconductor device and a method for manufacturing the same, and more specifically, to a semiconductor device having a field effect element and a method for manufacturing the same.

2. Description of the Background Art

Semiconductor integrated circuits have increased the tendency of high density and have achieved high speed operation and low voltage of power supply at the same time. Especially in advanced integrated logical circuits such as MPUs (micro processing units), in order to achieve these at the same time, the transistor performance has been increased and the current driving capability per channel width, i.e., unit area, has been enhanced.

A transistor having high current driving capability can obtain a sufficient output current in a smaller area, thus allowing for high integration.

In the meanwhile, still higher integration has been achieved by employing trench isolation as an element isolation means for electrically isolating a large number of elements. The trench isolation is a technique of electrically isolating elements by filling a trench disposed therebetween with an insulator. Recent advances in the technology of burying have made it possible to form a narrower and deeper element isolation insulating film.

FIG. 29 illustrates, in plan view, the construction of a semiconductor device 80 in which elements are electrically isolated from each other by trench isolation. Specifically, FIG. 29 is a fragmentary view when the semiconductor device 80 is seen from the top of its semiconductor substrate, and illustrates an arrangement of two MOS field effect transistors (hereinafter referred to as MOS transistors) M1 and M2.

The MOS transistors M1 and M2 are each surrounded by a trench isolation oxidation film and are electrically isolated from each other, and these are also electrically isolated from other semiconductor elements (not shown).

As shown in FIG. 29, the MOS transistor M1 has a larger channel width than the MOS transistor M2, and it comprises an elongated ate electrode 31 and a pair of source/drain regions 11 disposed in the semiconductor substrate surface located outside of the transversely opposite sides of the gate electrode 31. The gate electrode 31 at one end portion in the longitudinal direction is connected via a contact plug 51 to a wiring layer 61. The source/drain regions 11 are each connected via a plurality of contact plugs 511 to a wiring layer 611.

The MOS transistor M2 has an elongated gate electrode 32 and a pair of source/drain regions 12 disposed in the semiconductor substrate surface located outside of the transversely opposite sides of the gate electrode 32. The gate electrode 32 at one end portion in the longitudinal direction is connected via a contact plug 52 to a wiring layer 62. The source/drain regions 12 are each connected via a contact plug 521 to a wiring layer 621.

The constructions in cross section taken along line A—A and line B—B in FIG. 29 are illustrated in FIG. 30 and FIG. 31, respectively.

As shown in FIGS. 30 and 31, the MOS transistors M1 and M2 are electrically isolated from each other by a trench isolation oxide film 20 formed in the surface of a semiconductor substrate 1.

In the MOS transistors M1 and M2, a gate oxide film 30 underlies the gate electrodes 31 and 32. The gate electrodes 31 and 32 are comprised of a polycrystalline silicon (doped polysilicon) which, for example, contains phosphorus of about $1 \times 10^{20}$ to $5 \times 10^{20}/cm^3$ as impurity.

In FIGS. 30 and 31, the MOS transistors M1 and M2 are covered with an interlayer insulating film 40. The contact plugs 51, 52, 511 and 521 are disposed so as to extend through the interlayer insulating film 40, and the wiring layers 61, 62, 611 and 621 are disposed on the interlayer insulating film 40. Further, an interlayer insulating film (not shown) is disposed on the interlayer insulating film 40 and a wiring layer (not shown) is disposed on this interlayer insulating film. Thus, the wiring layers 61, 62, 611 and 621 are electrically connected to this wiring layer.

A method for manufacturing the semiconductor device 80 will be described by referring to FIGS. 32 to 38 illustrating a sequence of steps in the method. FIGS. 32 to 38 are cross sections taken along line A—A in FIG. 29.

In the step of FIG. 32, a silicon oxide film 3 and silicon nitride film 4 are formed on the entire surface of the semiconductor substrate 1. Then, by using a resist mask (not shown), the part of the silicon nitride film 4 and silicon oxide film 3 which corresponds to the region for forming an element isolation oxide film is selectively removed by anisotropic etching.

After the resist mask is removed, trenches 2 are formed by anisotropic etching by using the silicon nitride film 4 as a mask. This results in the construction of FIG. 32.

In the step of FIG. 33, damage by etching is recovered while the inner wall of the trenches 2 is covered with a silicon oxide film 10 by means of thermal oxidation.

In the step of FIG. 34, by CVD (chemical vapor deposition) method, a silicon oxide film 201 is formed on the entire surface so as to fill the trenches 2. Since the silicon oxide film 201 is formed so as to cover the silicon nitride film 4, the silicon oxide film 201 is left only in the trenches 2 and inside of the opening comprised of the silicon nitride film 4, by performing planarization with CMP (chemical mechanical polishing) process using the silicon nitride film 4 as a stopper.

In the step of FIG. 35, the silicon nitride film 4 and the underlying silicon oxide film 3 are removed to complete a trench isolation oxide film 20.

In the step of FIG. 36, a silicon oxide film is formed on the entire surface by thermal oxidation. Then, for instance, a polycrystalline silicon layer containing phosphorous is deposited on the enter surface by CVD method, and the polycrystalline silicon layer and silicon oxide film are patterned to form gate electrodes 31 and 32 and a gate oxide film 30. Subsequently, by ion implantation, impurity ion is implanted into the semiconductor substrate 1 such that source/drain regions (not shown) are formed in a self-aligned manner.

If required, the source/drain regions may be of LDD (lightly doped drain) structure by forming a side wall (not shown) and implanting additional impurity ion by ion implantation.

In the step of FIG. 37, a silicon oxide film is deposited on the entire surface thereby to form an interlayer insulating film 40. By using a resist mask (not shown), contact holes extending through the interlayer insulating film 40 to the gate electrode 31 or 32 are opened and the contact holes are then filled with a conductor layer, resulting in contact plugs 51 and 52.

FIG. 38 is a cross section taken along line B—B of FIG. 29, and illustrates the state that contact plugs 511 and 521 reaching the semiconductor substrate 1 are formed. FIG. 39 illustrates, in plan view, the construction after passing through the steps of FIGS. 37 and 38.

Subsequently, a metal layer is deposited on the entire surface of the interlayer insulating film 40 and then patterned to form wiring layers 61, 62, 611 and 621, thereby obtaining the construction shown in FIGS. 30 and 31. In addition, an interlayer insulating film (not shown) is formed on the interlayer insulating film 40 and a wiring layer (not shown) is disposed on this interlayer insulating film. Thus, the wiring layers 61, 62, 611 and 621 are electrically connected to this wiring layer. Such illustration and description are omitted here.

The foregoing conventional semiconductor device 80 having the MOS transistors is constructed so that the main current passes through a channel formed in the surface of the semiconductor substrate 1 underlying the gate electrodes 31 and 32, and then flows between the paired source/drain regions 11 and source/drain regions 12.

Accordingly, the current driving capability is defined by the gate width of the MOS transistor unless the performance of the MOS transistors is increased. If more output current is needed, it is necessary to increase the occupied area of the MOS transistors. The result is that the area of the overall semiconductor device is increased, thus imposing limitation on integration.

As previously mentioned, instead of the conventional LOCOS (local oxidation of silicon) isolation by means of thermal oxidation, the trench isolation has been used as an element isolation means. The trench isolation is a means for effecting element isolation by digging a trench in a semiconductor substrate by etching and then filling the trench with an insulating film.

In this trench isolation, an element isolation oxide film having a width of 0.1 μm is coming in practice by virtue of advances in the technology of burying an oxide film. However, the overall dimension of a semiconductor device using this element isolation oxide film is reduced only by the amount of the reduction in the isolation oxide film than that of a semiconductor device using the LOCOS isolation. This causes no change in the fact that the current driving capability of the MOS transistor is defined by the gate width.

SUMMARY OF THE INVENTION

According to a first aspect of the invention, a semiconductor device comprises: a semiconductor substrate; a MOS transistor disposed on the semiconductor substrate; and an element isolation insulating film for electrically isolating the MOS transistor from other semiconductor elements, disposed in a main surface of the semiconductor substrate, wherein the MOS transistor comprises a gate insulating film disposed on at least one active region defined as a region of the semiconductor substrate surrounded by the element isolation insulating film, and a gate electrode disposed on the gate insulating film, the element isolation insulating film has a groove portion disposed at the part bounded by the mentioned at least one active region, the side wall surface of the mentioned at least one active region is exposed in the groove portion, and the gate electrode is also disposed in the groove portion with the gate insulating film interposed therebetween.

According to a second aspect of the invention, the semiconductor device of the first aspect is characterized in that the mentioned at least one active region is a plurality of active regions arranged at spaced intervals along the direction in which the gate electrode extends, the active regions being electrically isolated from each other by the element isolation insulating film, and the groove portion is also disposed in the element isolation insulating film for isolating the active regions.

According to a third aspect of the invention, the semiconductor device of the first aspect further comprises at least one local insulating film disposed in the surface of the semiconductor substrate underlying the gate electrode in the mentioned at least one active region, wherein the mentioned at least one local insulating film has a groove portion disposed at the part bounded by the mentioned at least one active region around the local insulating film, and the side wall surface of the mentioned at least one active region is exposed in the groove portion.

According to a fourth aspect of the invention, the semiconductor device of the second or third aspect is characterized in that in the opening of the groove portion, the depth dimension along the side wall surface is greater than the width dimension of the top.

According to a fifth aspect of the invention, the semiconductor device of the fourth aspect is characterized in that the cross-sectional shape of the upper edge portion of the mentioned at least one active region is in a circular arc.

According to a sixth aspect of the invention, the semiconductor device of the second aspect is characterized in that in the element isolation insulating film for isolating the active regions, the width dimension along the direction of extension of the gate electrode is smaller than twice the depth dimension along the side wall surface of the groove portion.

According to a seventh aspect of the invention, the semiconductor device of the third aspect is characterized in that in the local insulating film, the width dimension along the direction of extension of the gate electrode is smaller than twice the depth dimension along the side wall surface of the groove portion.

According to an eighth aspect of the invention, a method for manufacturing a semiconductor device having a MOS transistor comprises the steps of: (a) forming a trench defining at least one active region in a main surface of a semiconductor substrate; (b) burying an insulating film in the trench; (c) planarizing the insulting film; (d) reducing the thickness of the insulting film by isotropic etching so as to have approximately the same height as the main surface of the mentioned at least one active region, and forming a groove portion at the boundary part between the insulating film and the mentioned at least one active region so as to expose the side wall surface of the mentioned at least one active region; and (e) forming a gate insulating film and a gate electrode of the MOS transistor on the mentioned at least one active region.

According to a ninth aspect of the invention, the method of the eighth aspect is characterized in that: the step (a) includes the steps of forming a silicon oxide film and a silicon nitride film in sequence on the main surface of the semiconductor substrate and forming the trench by selectively etching the silicon oxide film, the silicon nitride film and the semiconductor substrate; the step (c) includes the step of planarizing the insulating film by using the silicon nitride film as a stopper; and the step (d) includes the step in which the silicon nitride film serving as the stopper is removed to form a recess portion on the surface of the insulating film, followed by the isotropic etching.

According to a tenth aspect of the invention, the method of the eight aspect further comprises the step, after the step (d), of performing an oblique ion implantation to the mentioned at least one active region.

According to an eleventh aspect of the invention, the method of the tenth aspect is characterized in that the oblique ion implantation includes the step of performing the ion implantation a number of times with the semiconductor substrate inclined with respect to the direction of transport of ion beams.

According to a twelfth aspect of the invention, the method of the eleventh aspect is characterized in that the step of performing the oblique ion implantation a number of times includes the steps of: performing the ion implantation each time the semiconductor substrate is intermittently rotated in the plane a predetermined angle; and setting a rotational number N such that the angle of inclination $\theta$ of the semiconductor substrate and the intermittent rotational number N of the semiconductor substrate satisfy the relationship of $N=1/COS\ \theta$.

According to a thirteenth aspect of the invention, the method of the twelfth aspect is characterized in that the ion implantation step is the step, before the step (e), of performing ion implantation for determining the threshold value of the MOS transistor.

According to a fourteenth aspect of the invention, the method of the twelfth aspect is characterized in that the ion implantation step is the step, after the step (f), of performing ion implantation for forming the source/drain regions of the MOS transistor.

According to a fifteenth aspect of the invention, the method of the eighth aspect further comprises the step, before the step (b), of subjecting the inner surface of the trench to thermal oxidation, wherein, by the thermal oxidation step, the cross-sectional shape of the upper edge portion of the mentioned at least one active region is formed into a circular arc.

According to a sixteenth aspect of the invention, the method of the fifteenth aspect is characterized in that the thermal oxidation step includes a high temperature thermal oxidation step conducted in an atmosphere containing oxygen at a temperature of 1000 to 1200° C.

According to a seventeenth aspect of the invention, the method of the eighth aspect further comprises the step, before the step (b), of hydrogen annealing step conducted in a hydrogen atmosphere at a temperature of 850 to 1000° C., wherein, by the hydrogen annealing step, the cross-sectional shape of the upper edge portion of the mentioned at least one active region is formed into a circular arc.

In the semiconductor device of the first aspect, the element isolation insulating film has the groove portion disposed at the part bounded by at least one active region, and the wall surface of at least one active region is exposed in the groove portion, and the gate electrode is also disposed in the groove portion with the gate insulting film. Therefore, the side wall part of at least one active region can also be used as a channel region. This enables to increase the current driving capability of the MOS transistor without increasing the gate width, and thus permitting the semiconductor device that can obtain more output current without increasing the occupied area of the MOS transistor. In addition, since the groove portion is merely disposed at the boundary part between the element isolation insulating film and at least one active region, the surface of the gate electrode disposed thereon can be planarized. This increases the dimensional accuracy at the time of photolithography, thus permitting the MOS transistor causing less variations in transistor characteristic.

In the semiconductor device of the second aspect, at least one active region is provided as a plurality of active regions arranged at spaced intervals along the direction in which the gate electrode extends, and the groove portion is also disposed in the element isolation insulating film for isolating a plurality of active regions. Thereby, the effective channel region width can be further increased and the current driving capability can be increased to permit higher speed operation. In addition, since the current driving capability per unit area is increased, the MOS transistor can be further minimized to reduce the chip size.

In the semiconductor device of the third aspect, at least in one active region, at least one local insulating film is disposed in the surface of the semiconductor substrate underlying the gate electrode, and the groove portion is also provided at the boundary part between the local insulating film and the active region therearound. Thereby, the effective channel region width can be further increased and the current driving capability can be increased to permit higher speed operation. In addition, because at least one active region is basically of unitary configuration, wide source/drain regions can be obtained to increase the degree of freedom of the contact hole disposition with respect to the source/drain regions. As a result, the design margin is increased and a further reduction in chip size can be expected.

In the semiconductor device of the fourth aspect, the groove portion of the element isolation insulating film for isolating a plurality of active regions has the opening in which the depth dimension along the sidewall surface is greater than the width of the top. This permits a further increase in the effective channel region width.

In the semiconductor device of the fifth aspect, the upper edge portion of at least one active region is rounded by increasing its radius of curvature. This enables to prevent the reverse narrow channel effect caused by the fringing field from the gate electrode.

In the semiconductor device of the sixth aspect, in the element isolation insulating film for isolating a plurality of active regions, the width dimension along the direction of extension of the gate electrode is smaller than twice the depth dimension along the sidewall surface of the groove portion. Thereby, the channel region at the side wall part of each active region is larger than the width dimension of the element isolation insulating film, thus permitting a further increase in the effective channel region width.

In the semiconductor device of the seventh aspect, the width dimension along the direction of extension of the gate electrode in the local insulating film is smaller than twice the depth dimension along the sidewall surface of the groove portion. Thereby, the channel region at the side wall part of each active region is larger than the width dimension of the local insulating film, thus permitting a further increase in the effective channel region width.

With the method of the eighth aspect, it is able to obtain the semiconductor device in which the element isolation insulating film has the groove portion disposed at the part bounded by at least one active region, and the side wall surface of at least one active region is exposed in the groove portion, and the gate electrode is also disposed in the groove portion with the gate insulating film.

With the method of the ninth aspect, the groove portion can be reliably formed at the boundary part between the insulating film and at least one active region by removing the silicon nitride film used as a stopper, to form the recess part in the surface of the insulating film, followed by isotropic etching in an over etching fashion.

With the method of the tenth aspect, ion implantation can be performed to the exposed side wall surface of at least one active region, thereby the side wall part of the active region can be used as a channel region.

With the method of the eleventh aspect, ion implantation can be performed reliably to the exposed side wall surface of at least one active region.

With the method of the twelfth aspect, when the semiconductor substrate is inclined at an angle θ, the dose to the planarized part is reduced than that would be the case without inclining the semiconductor substrate, however, a predetermined dose is obtainable by setting the number of rotations N so as to satisfy the relationship of N=1/COS θ.

With the method of the thirteenth aspect, it is able to implant a predetermined amount of ion for determining the threshold value of the MOS transistor.

With the method of the fourteenth aspect, it is able to implant a predetermined amount of ion for forming the source/drain regions of the MOS transistor.

With the method of the fifteenth aspect, the upper edge portion of at least one active region can be formed into a circular arc by the step of subjecting the inner surface of the trench to thermal oxidation. It is therefore able to suppress the manufacturing steps from being complicated in order to obtain the semiconductor device preventing the reverse narrow channel effect caused by the fringing field from the gate electrode.

With the method of the sixteenth or seventeenth aspect, the upper edge portion of at least one active region can be reliably formed into a circular arc.

It is an object of the present invention to overcome the foregoing drawbacks by providing a semiconductor device capable of obtaining more output current without increasing the occupied area of a MOS transistor, as well as a method for manufacturing the same.

These and other objects, features, aspects and advantages of the present invention will become more apparent from the following detailed description of the present invention when taken in conjunction with the accompanying drawings.

DESCRIPTION OF THE PREFERRED EMBODIMENTS

A. Device Construction

A-1. Construction in Plan or Cross Section View

Figure 1:
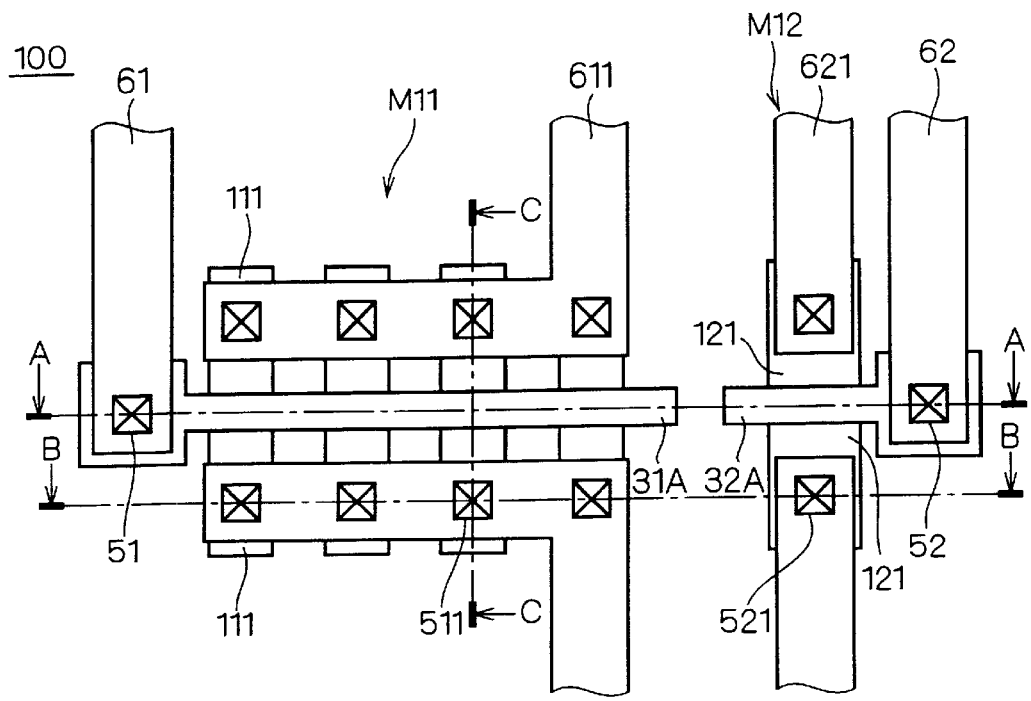
FIG. 1 is a plan view illustrating the construction of a semiconductor device according to one preferred embodiment of the invention.

As one preferred embodiment of the present invention, FIG. 1 illustrates, in plan view, the construction of a semiconductor device 100 in which elements are electrically isolated by trench isolation. FIG. 1 is a fragmentary view when the semiconductor device 100 is seen from the top of its semiconductor substrate, and illustrates the arrangement of two MOS field effect transistors (hereinafter referred to as MOS transistors) M11 and M12.

The MOS transistors M11 and M12 are each surrounded by a trench isolation oxide film and are electrically isolated from each other, and these are also electrically isolated from other semiconductor elements (not shown).

As shown in FIG. 1, the MOS transistor M11 has an elongated gate electrode 31A and a plurality of source/drain regions 111 which are arranged in pairs in the semiconductor substrate surface located outside of the transversely opposite sides of the gate electrode 31A. The adjacent source/drain regions 111 in the direction in which the gate electrode 31A extends are isolated by a trench isolation oxide film, and the plural source/drain regions 111 are respectively connected via a plurality of contact plugs 511 to a wiring layer 611. The gate electrode 31A at one end portion in the longitudinal direction is connected via a contact plug 51 to a wiring layer 61.

Since a plurality of source/drain regions 111 on one side of the gate electrode 31A are connected to a common wiring layer 611, it can be considered that such a construction is substantially identical with that obtained by dividing a pair of source/drain region. This is true for a plurality of source/drain regions 111 on the other side.

The MOS transistor M12 has an elongated gate electrode 32A and a pair of source/drain regions 121 disposed in the semiconductor substrate surface located outside of the transversely opposite sides of the gate electrode 32A. The gate electrode 32A at one end portion in the longitudinal direction is connected via a contact plug 52 to a wiring layer 62. The source/drain regions 121 is connected via a contact plug 521 to a wiring layer 621.

Figure 2:
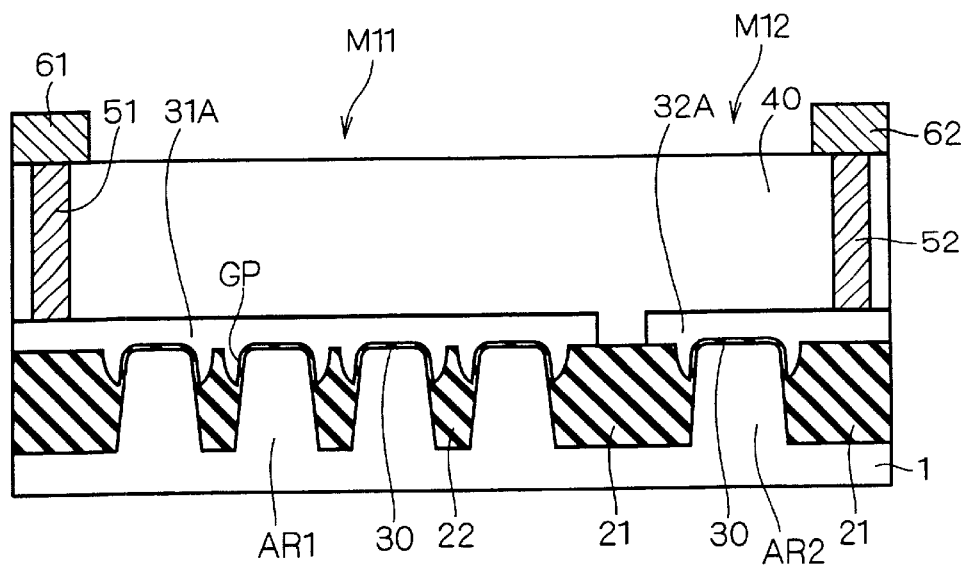
FIGS. 2 to 4 are cross sections illustrating the construction of a semiconductor device according to one preferred embodiment.
Figure 3:
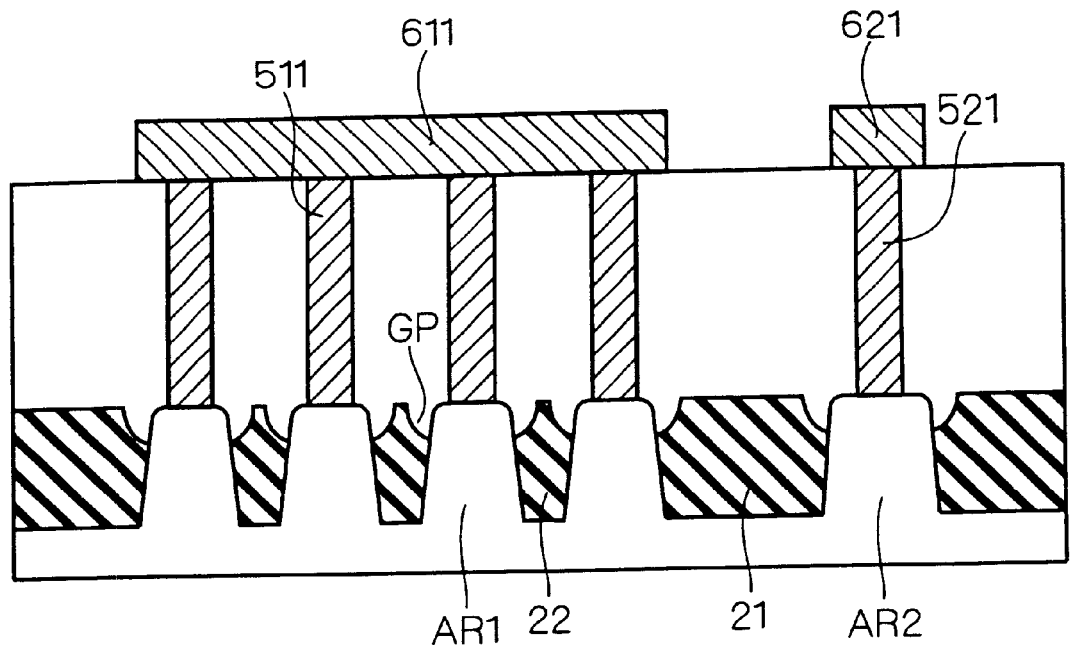

The construction in cross section taken along line A—A and line B—B of FIG. 1 are illustrated in FIG. 2 and FIG. 3, respectively.

As shown in FIGS. 2 and 3, the MOS transistors M11 and M12 are electrically isolated by a trench isolation oxide film 21 formed in the surface of a semiconductor substrate 1.

In the MOS transistor M11, its active region AR1 is divided by a trench isolation oxide film 22 having a width of 50 nm to 200 nm. As used herein, the term "the active region AR1" denotes the region including the source/drain regions 111 and the area of the semiconductor substrate 1 existing therebetween.

At the boundary part between the trench isolation oxide film 22 and the active region AR1, a groove portion GP having an opening in which the width of the top is 20 nm to 80 nm and the depth is 50 nm to 150 nm, is disposed so as to surround the active region AR1. The groove portion GP is formed such that the side wall surface of the active region AR1 is exposed on the inside of the groove portion GP. The gate electrode 31A is not only disposed above the active region AR1 but also is buried in the groove portion GP with a gate oxide film 30 interposed therebetween.

The side wall surface of the active region AR1 has an angle of nearly a right angle, and the depth of the groove portion GP is defined as a depth along this side wall surface.

Note that the groove portion GP is disposed not only in the surface of the trench isolation oxide film 22 but also at the boundary part between the trench isolation oxide film 21 and the active region AR1.

Also in the MOS transistor M12, a groove portion GP is disposed at the boundary part between the trench isolation oxide film 21 and an active region AR2, so as to surround the active region AR2. The gate electrode 32A is not only disposed above the active region AR2 but also is buried in the groove portion GP with the gate oxide film 30 interposed therebetween. As used herein, the term "the active region AR2" denotes the region including the paired source/drain regions 121 and the area of the semiconductor substrate 1 existing therebetween.

The gate electrodes 31A and 32A are comprised of a polycrystalline silicon (doped polysilicon) which contains, for example, phosphorus of about $1\times10^{20}$ to $5\times10^{20}/cm^3$ as impurity.

Note that the gate oxide film 30 is disposed not only on the upper surface of the active regions AR1 and AR2, but also is uniformly formed so as to cover the upper edge portions of the active regions AR1 and AR2 and also the side wall surface exposed in the groove portion GP.

Referring to FIGS. 2 and 3, the MOS transistors M11 and M12 are covered with an interlayer insulating film 40, and contact plugs 51, 52, 511 and 521 are provided so as to extend through the interlayer insulating film 40. Although the wiring layers 61, 62, 611 and 621 are disposed on the interlayer insulating film 40, in fact, an interlayer insulating film (not shown) is disposed on the film 40 and a wiring layer (not shown) is disposed on this interlayer insulating film. Thus, the wiring layers 61, 62, 611 and 621 are electrically connected to this wiring layer.

Figure 4:
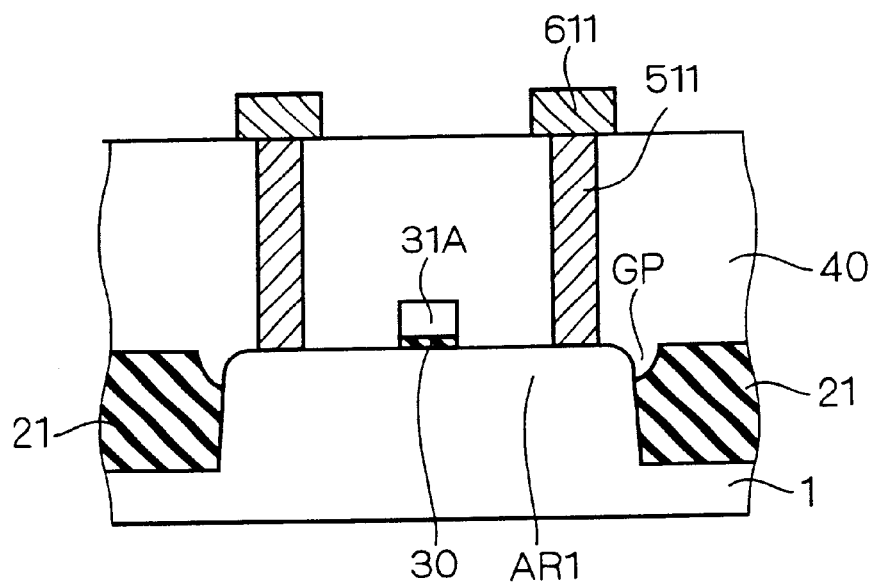

A construction in cross section taken along line C—C of FIG. 1 is illustrated in FIG. 4. As shown in FIG. 4, the groove portion GP is provided so as to surround the active region AR1.

A-2. Depth of Groove Portion

Figure 5:
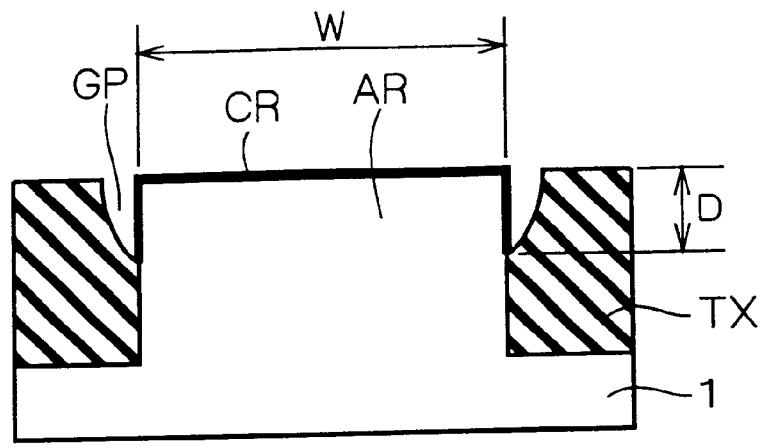
FIGS. 5 and 6 are schematic diagrams illustrating the resulting effect obtained by providing a groove portion.
Figure 6:
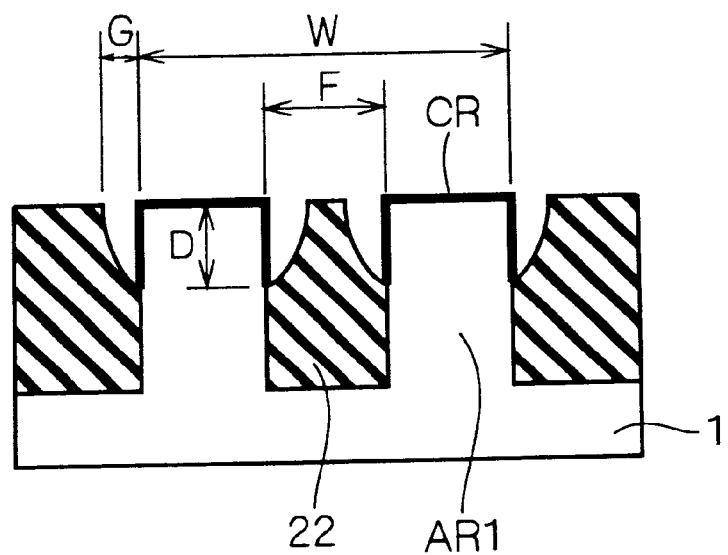

FIGS. 5 and 6 are schematic diagrams illustrating the resulting effect obtained by providing the groove portion GP. FIG. 6 illustrates schematically the trench isolation oxide film 22 and active region ARI of the MOS transistor M11 in FIG. 2.

FIG. 5 illustrates such a construction that the groove portion GP is disposed at the boundary part between an active region AR and a trench isolation oxide film TX surrounding the active region AR. In the figure, W denotes the width dimension of the active region AR.

Figure 29:
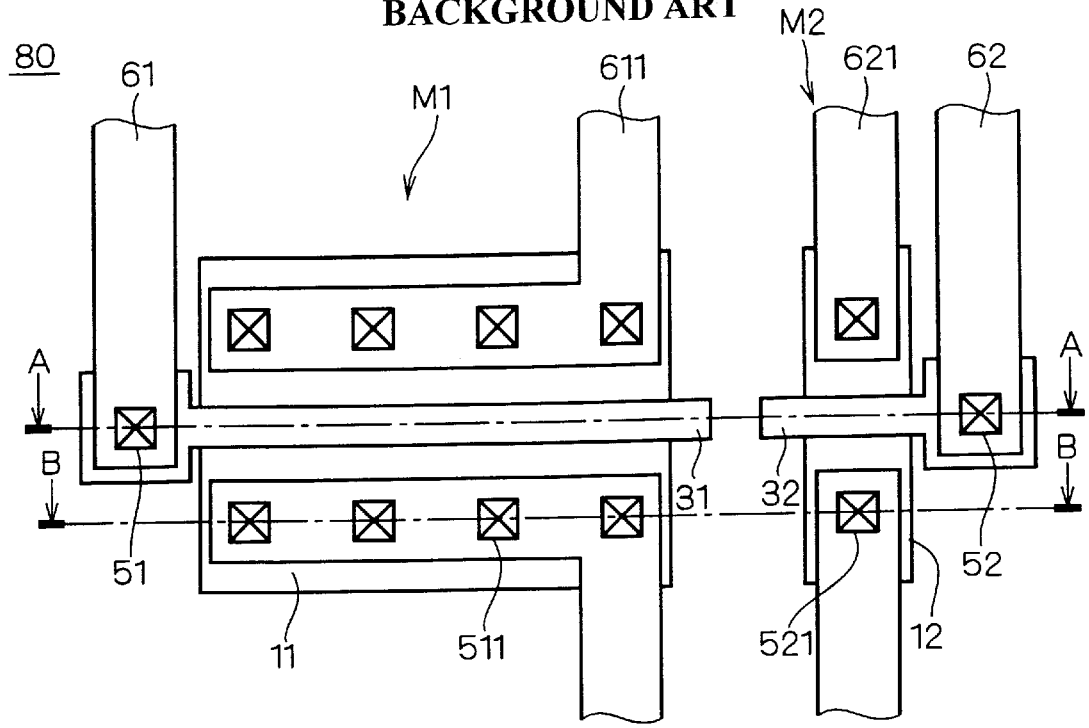
FIG. 29 is a plan view of a conventional semiconductor device.
Figure 30:
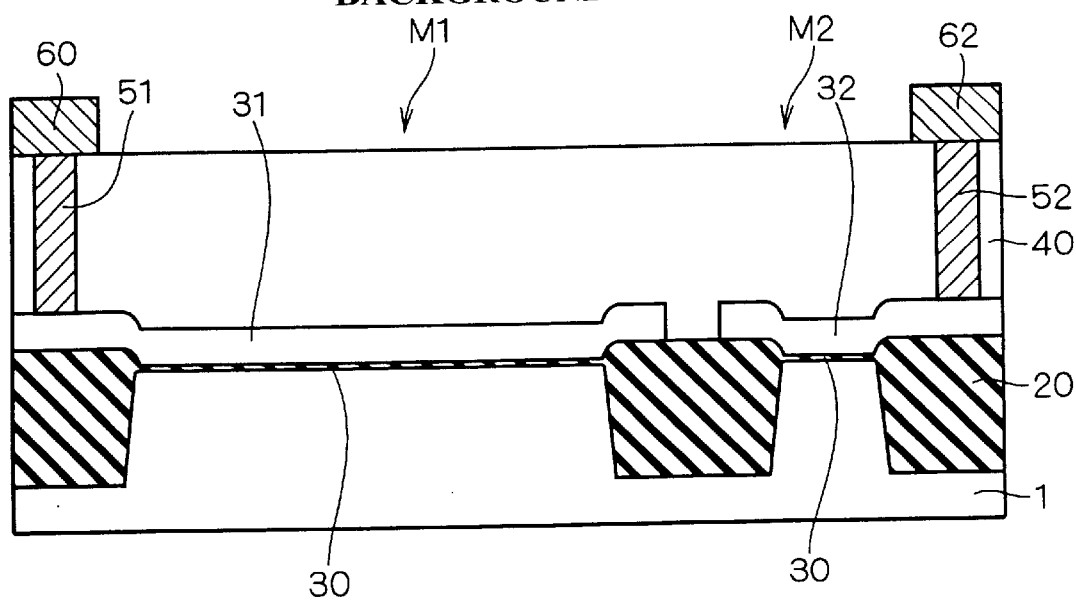
FIGS. 30 and 31 are cross sections illustrating the construction of a conventional semiconductor device.
Figure 31:
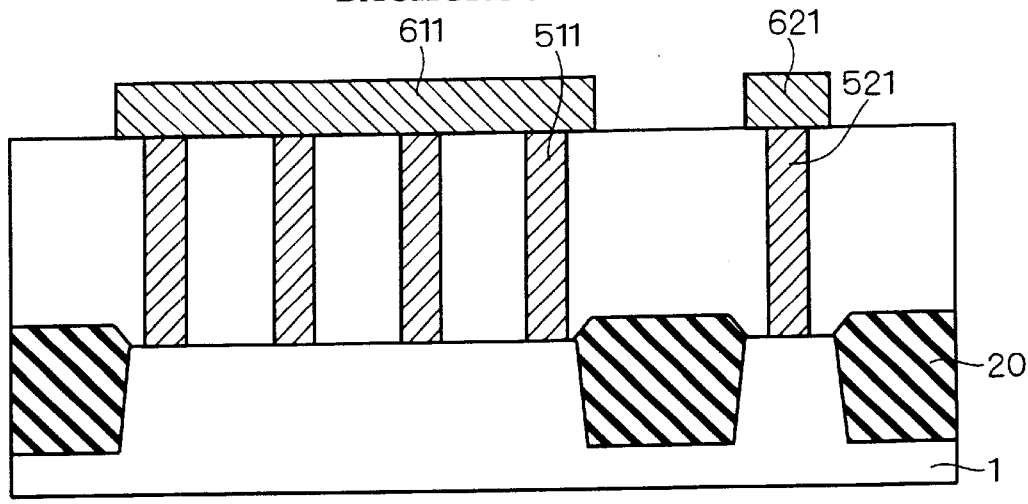
Figure 32:
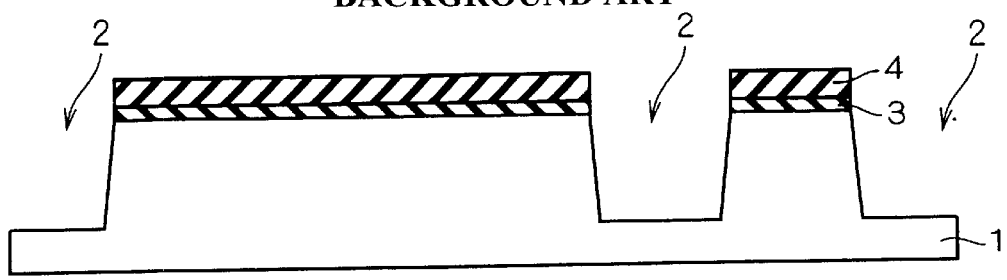
FIGS. 32 to 38 are cross sections illustrating a sequence of steps in a conventional method for manufacturing a semiconductor device.
Figure 33:
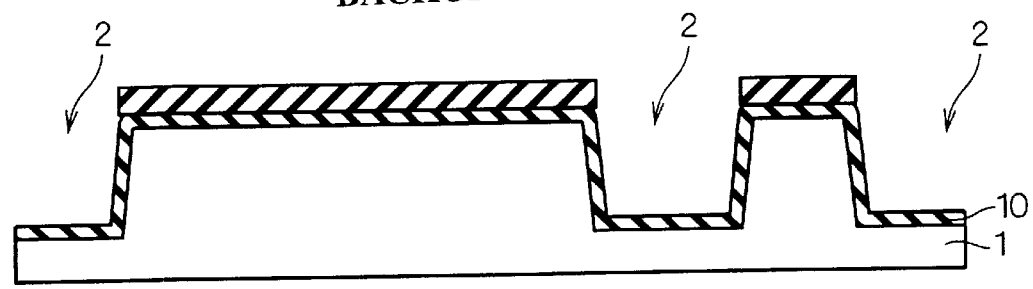
Figure 34:
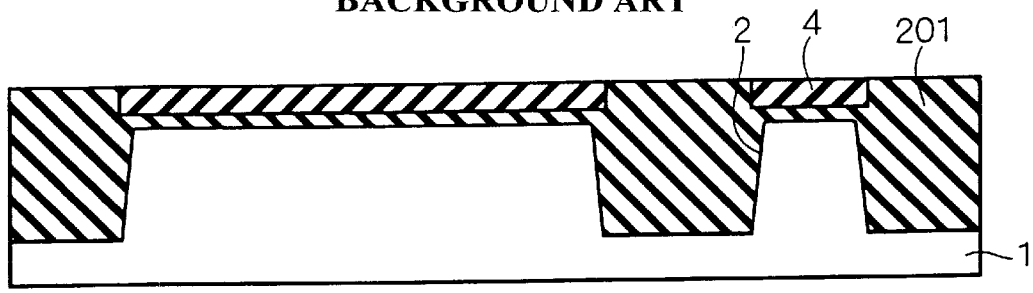
Figure 35:
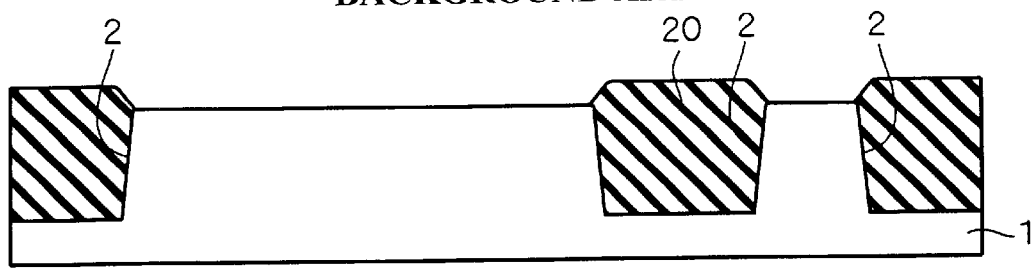
Figure 36:
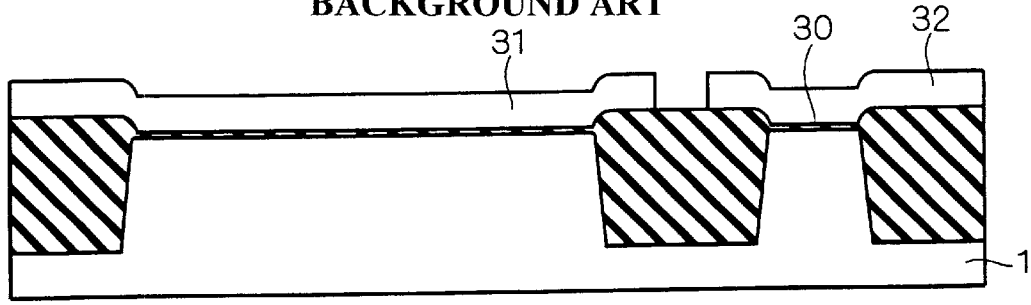
Figure 37:
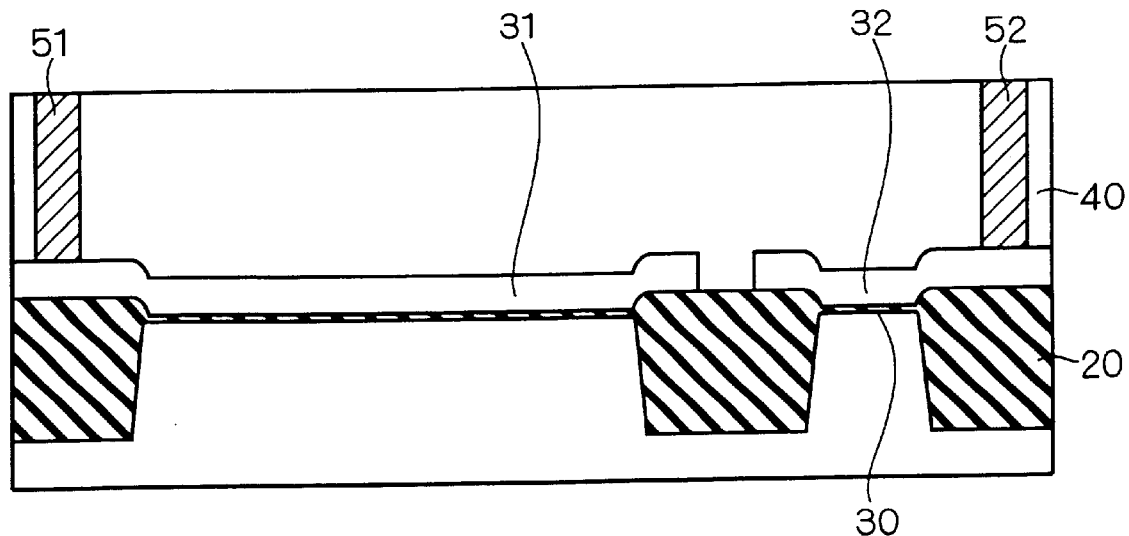
Figure 38:
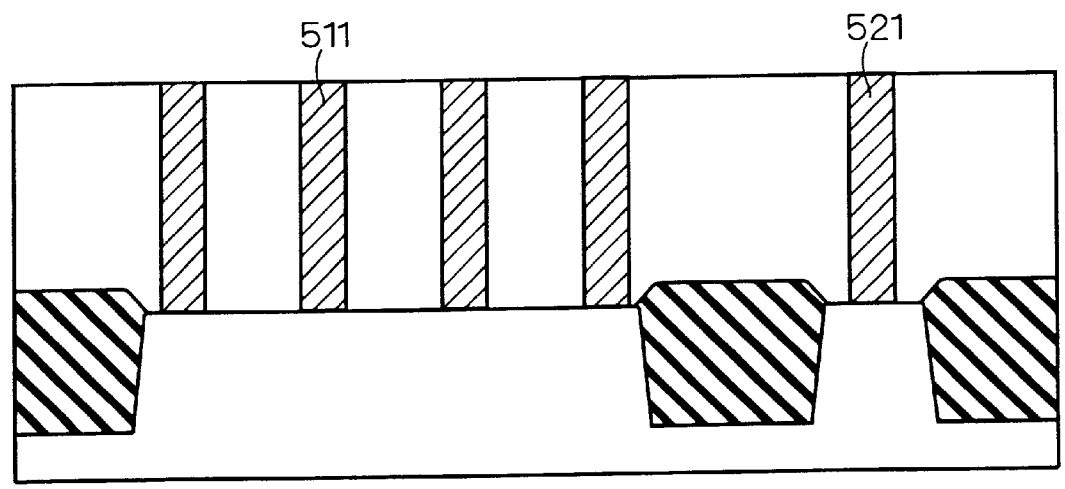
Figure 39:
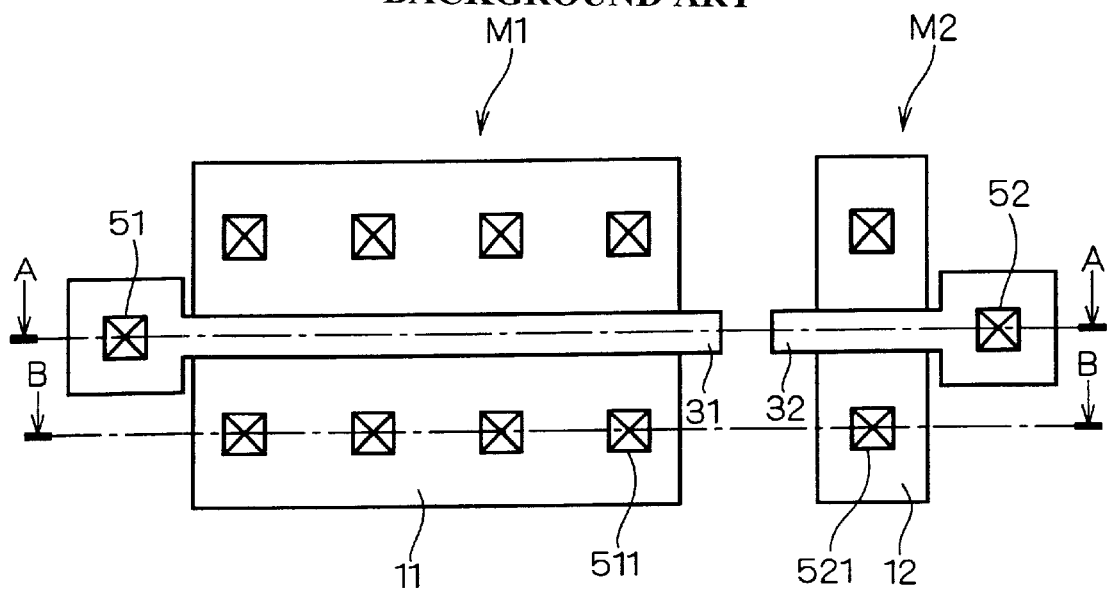
FIG. 39 is a plan view illustrating the construction of a conventional semiconductor device in the course of the manufacturing.

In the MOS transistor M1 of FIG. 29, the channel region width is substantially the same as the width dimension of the active region. In contrast, by providing the groove portion GP so as to surround the active region AR, as shown in FIG. 5, the side wall part of the active region AR can be used as a channel region CR, thereby increasing the effective channel region width.

In addition, in the case that the active region AR is divided by the trench isolation oxide film 22 to provide a plurality of active regions AR1, and the groove portion GP is provided therearound, as shown in FIG. 6, it is able to further increase the effective channel region width by setting the depth of the groove portion GP to more than one half of the width dimension of the trench isolation oxide film 22.

In FIG. 6, W denotes the dimension of the region where a plurality of trench isolation oxide films 22 will be formed, F denotes the width dimension of the trench isolation oxide film 22, and D denotes the depth of the groove portion GP. When 2D>F is held, the effective channel region width can be further increased than that in the construction of FIG. 5. Note that the dimension of the region indicated by arrow G in FIG. 6 denotes the width of the top of the opening in the groove portion GP.

When the side wall part of the active region is used as a channel region, it may be in such a shape that the trench isolation oxide film is entirely further dug, instead of employing the groove portion. In this event, however, irregularities may take place in the surface of the gate electrode due to a step between the trench isolation oxide film and the active region.

Figure 7:
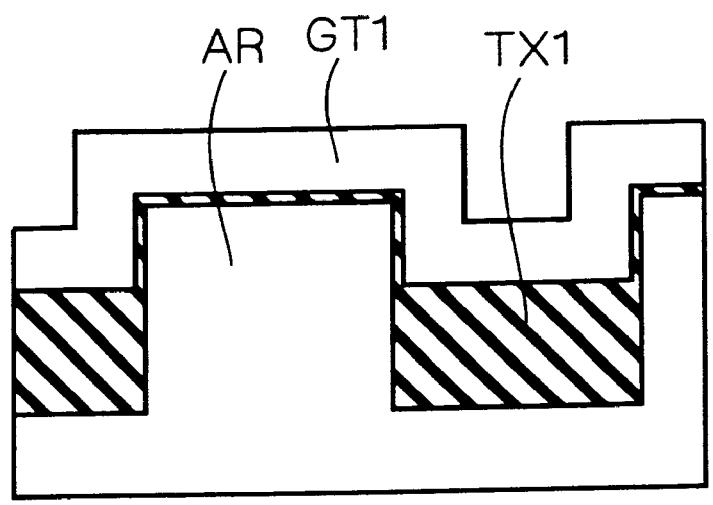
FIG. 7 is a schematic diagram illustrating the construction of a trench isolation oxide film of which upper surface is entirely further dug.

FIG. 7 illustrates schematically such a construction that the active region AR is surrounded by a trench isolation oxide film TX1, the entire upper surface of which is further dug. In this construction, it is possible to use the side wall part of the active region AR as a channel region by forming a gate electrode ARI on the active region AR and trench isolation oxide film TX1. However, the gate electrode GT1 will be formed along the shape of the step between the trench isolation oxide film TX1 and active region AR, resulting in the shape of successive irregularities. This shape will further cause irregularities in the overlying layers.

In photolithography, there is the tendency that as miniaturization is advanced, the depth of focus is shallower and the focus margin is reduced. Therefore, it is undesirable to cause a step having a large difference of altitude.

Figure 8:
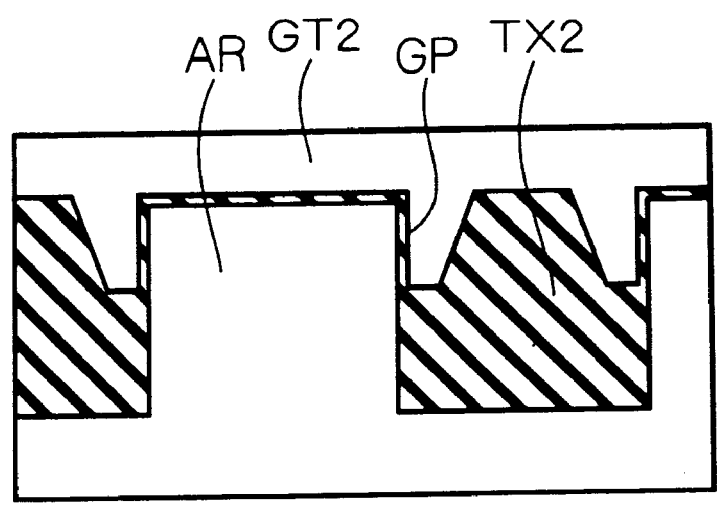
FIG. 8 is a schematic diagram illustrating the construction of a trench isolation oxide film that has a groove portion at the part bounded by an active region.

As shown in FIG. 8, in a trench isolation oxide film TX2 having the groove portion GP at the part bounded by the active region AR, by minimizing the width of the top of the opening, the surface of the gate electrode GT2 to be formed on the active region AR and trench isolation oxide film TX2 can be planarized, thus increasing the dimensional accuracy at the time of lithography.

A-3. Shape of Active Region's Edge Portion

The shape of the edge portion of the active region will be described by referring to FIG. 2 with the aid of FIG. 9. As shown in FIG. 2, the upper edge portions of the active regions AR1 and AR2 are in a rounded (arcuate) cross-sectional shape (i.e., a round portion). The radius of curvature is about 30 nm, thereby suppressing convergence of the fringing field due to the gate electrodes 31A and 32A.

That is, the gate electrodes 31A and 32A shown in FIG. 2 are disposed so as to cover, via the gate oxide film 30, the upper edge portions of the active regions AR1 and AR2. With this construction, when voltage is applied to the gate electrodes 31A and 32A, a fringing field occurs in the area covering the upper edge portions of the active regions AR1 and AR2. Further, when the upper edge portions of the active regions AR1 and AR2 have a small radius of curvature, the fringing field converges and the threshold voltage is lowered (i.e., reverse narrow channel effect). However, in the experiments executed by the present inventors, it was found that a decrease in threshold voltage could be suppressed by setting the radius of curvature of the upper edge portion of the active region to a certain magnitude with respect to the width of the active region.

Figure 9:
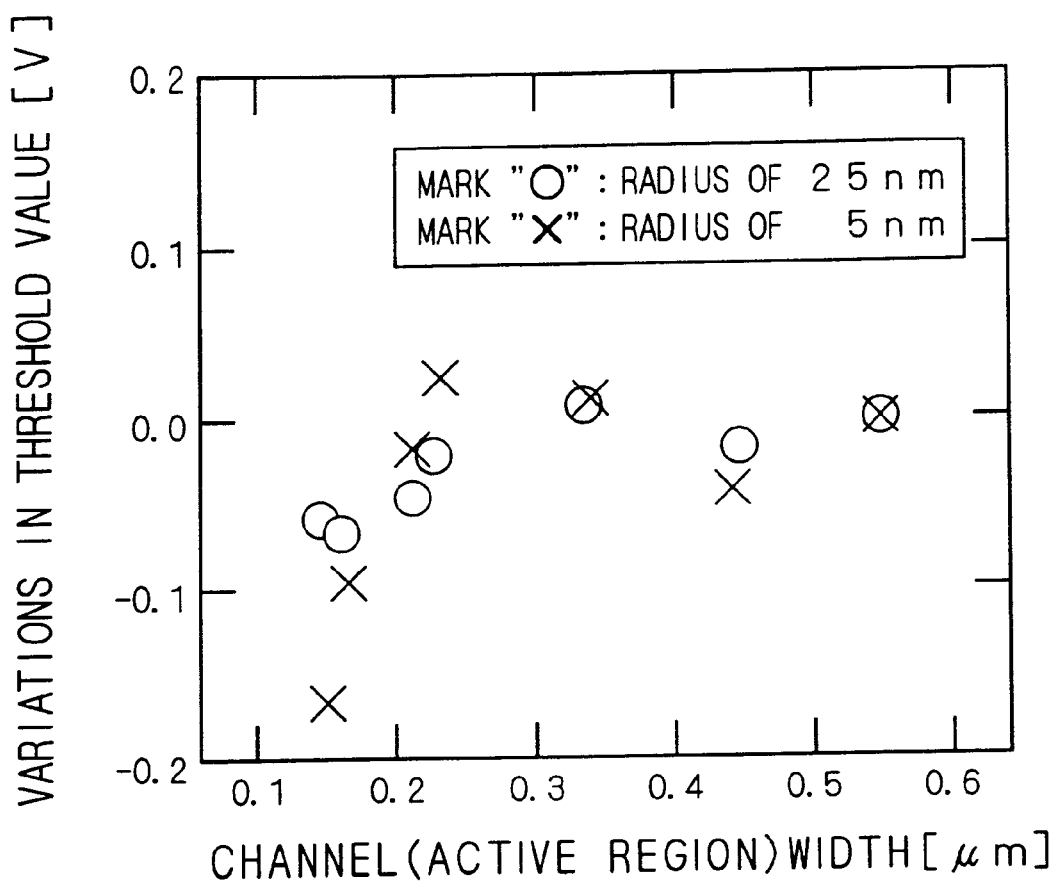
FIG. 9 is a diagram illustrating variations in the threshold voltage to the channel region width.

FIG. 9 is a graph diagram that plots variations in the threshold voltage with respect to the channel region width (active region width) when the radius of curvature of the upper edge portion of the active region is 5 nm or 25 nm. In FIG. 9, a transistor having an active region width of 0.57 $\mu$m is used as a reference object, and transistors having an active region width of not more than 0.2 $\mu$m have the following features that when the radius of curvature of the upper edge portion is 5 nm, the threshold voltage is lowered considerably as the active region width is reduced, and that when the radius of curvature of the upper edge portion is 25 nm, the threshold voltage is hardly changed.

Thus, by setting the radius of curvature of the upper edge portion (round portion) of the active region to about 25 nm, a threshold voltage reduction can be suppressed even in the MOS transistor M11 having an active region 22 of which active region width is in the range of 50 nm to 200 nm.

B. Manufacturing Method

B-1. Outline of Manufacturing Steps

A method for manufacturing a semiconductor device 100 will be described by referring to FIGS. 10 to 16 illustrating a sequence of steps in the method. FIGS. 10 to 16 are cross sections taken along line A—A in FIG. 29.

Figure 10:
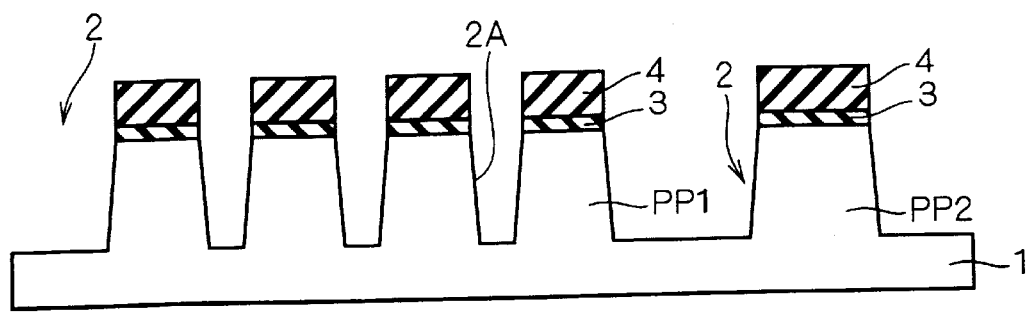
FIGS. 10 to 16 are cross sections illustrating a sequence of steps in a method for manufacturing a semiconductor device according to one preferred embodiment.

In the step of FIG. 10, a silicon oxide film 3 is formed on the entire upper main surface of a semiconductor substrate 1 in a thickness of 10 nm to 30 nm by thermal oxidation, and a silicon nitride film 4 is then formed in a thickness of 100 nm to 250 nm by CVD (chemical vapor deposition) method. At a later time, the thickness of the silicon nitride film 4 exerts an influence on adjustment of the height of a trench isolation oxide film, and therefore, the thickness of the silicon nitride file 4 should be set taking the height of the trench isolation oxide film into consideration.

Subsequently, by using a resist mask (not shown), the part of the silicon nitride film 4 and silicon oxide film 3 which corresponds to the region for forming trench isolation oxide films 21 and 22 are selectively removed by anisotropic etching. After the resist mask is removed, by using the silicon nitride film 4 as a mask, trenches 2 and 2A having a depth of 100 nm to 400 nm are formed by anisotropic etching, to obtain projected regions PP1 and PP2 which will become an active region AR1. This results in the construction of FIG. 10.

Figure 11:
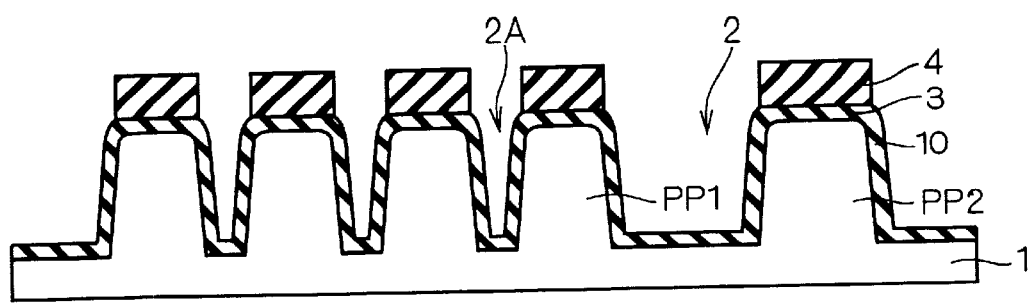

In the step of FIG. 11, damage by etching is recovered while the inner walls of the trenches 2 and 2A are covered with a silicon oxide film 10 having a thickness of 10 nm to 30 nm by thermal oxidation. At this time, the upper edge portions of the projected regions PP1 and PP2 are formed into a rounded cross-sectional shape having a radius of curvature of about 30 nm.

Figure 12:
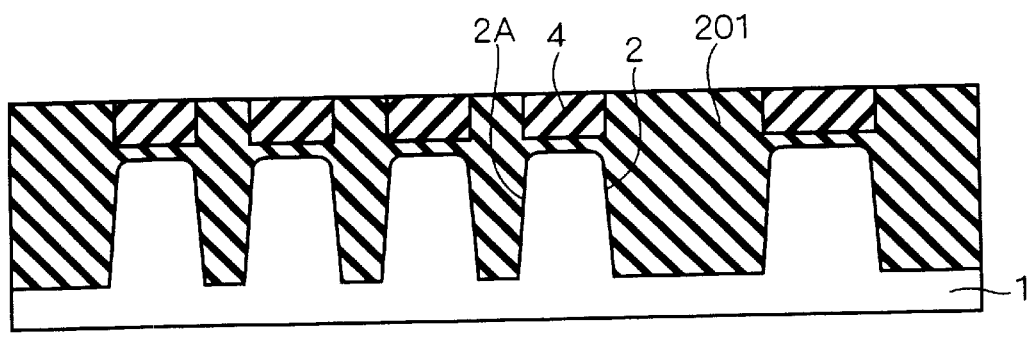

In the step of FIG. 12, by CVD method, a silicon oxide film 201 having a thickness of 300 nm to 800 nm is formed on the entire surface so as to fill the trenches 2 and 2A. The silicon oxide film 201 is formed so as to cover the silicon nitride film 4. Therefore, by using the silicon nitride film 4 as a stopper, planarization is performed by means of CMP (chemical mechanical polishing) process so that the silicon oxide film 201 is left only in the trenches 2 and 2A and in the interior of the opening comprised of the silicon nitride film 4.

Figure 13:
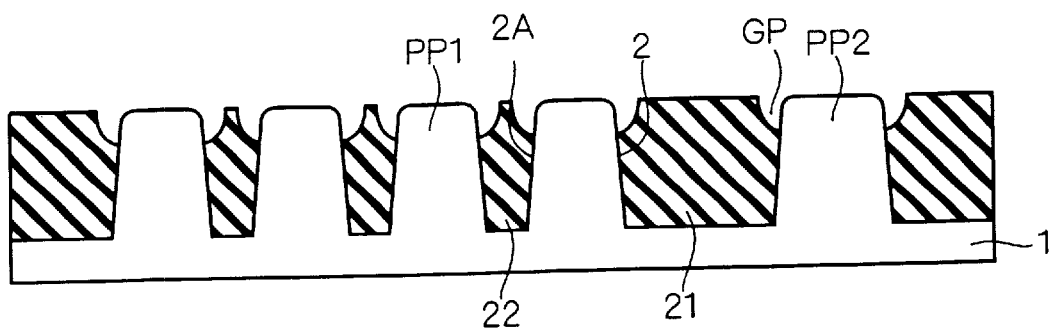

In the step of FIG. 13, the silicon nitride film 4 is removed by wet etching using thermal phosphoric acid. Then, the silicon oxide film 3 is removed by wet etching using hydrofluoric acid, and the thickness of the silicon oxide film 201 is reduced to form trench isolation oxide films 21 and 22 within the trenches 2 and 2A, respectively. At this time, the etching condition is set such that, by a depth of about 50 nm to 150 nm from the upper main surface of the semiconductor substrate 1, namely, the upper main surface of the projected regions PP1 and PP2, the edge portions of the trench isolation oxide films 21 and 22 are recessed to form a groove portion GP at the same time, and that the upper surface of the semiconductor substrate 1 has approximately the same height as the planarized part of the trench isolation oxide films 21 and 22. The formation of the groove portion GP will be fully described by referring to FIGS. 18 to 20.

Subsequently, there are performed ion implantation (well implantation) for forming a well region and ion implantation (channel implantation) for determining the threshold value of a transistor, so that the projected regions PP1 and PP2 become active regions AR1 and AR2, respectively. These ion implantations are carried out in the following manner that the wafer is inclined and rotated intermittently in the plane of the wafer (i.e., rotational oblique implantation). Thereby, the main surface part and side wall part of the active regions AR1 and AR2 can have approximately the same effective dose, and thus the threshold voltage can be made uniform. The rotational oblique implantation will be fully described by referring to FIGS. 21 and 22.

Figure 14:
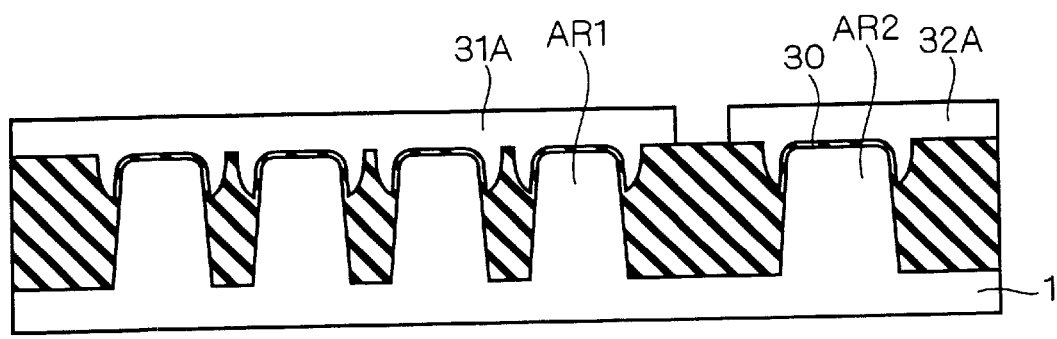

In the step of FIG. 14, a silicon oxide film having a thickness of 3 nm to 10 nm is formed on the entire surface by thermal oxidation. In addition, a polycrystalline silicon layer (doped polysilicon layer) which contains phosphorus of about $1 \times 10^{20}$ to $50 \times 10^{20}/\text{cm}^3$ and has a thickness of 50 nm to 100 nm is formed on the entire surface by CVD method. Subsequently, the polycrystalline silicon layer and silicon oxide film are patterned by anisotropic etching using a resist mask, thereby to form gate electrodes 31A and 32A and a gate oxide film 30.

In the formation of the gate electrodes 31A and 32A, when the upper main surface of the semiconductor substrate 1, namely, the upper surface of the active regions AR1 and AR2, has approximately the same height as the planarized part of the trench isolation oxide films 21 and 22, even if the depth of focus is shallow and the focus margin is small in photolithography, the resist mask can be formed at high accuracy and the dimensional accuracy of the gate electrodes 31A and 32A can be increased.

Thereafter, for instance, phosphorous (P) or arsenic (As) for an N channel MOS transistor, alternatively, boron (B) or boron fluoride (BF) for a P channel MOS transistor, is implanted at an energy of 10 to 40 keV and a dose of about $1 \times 10^{15}$ to $5 \times 10^{15}/\text{cm}^2$, thereby to form source/drain regions (not shown).

This ion implantation (source/drain implantation) is carried out by rotational oblique implantation wherein the wafer is inclined and rotated intermittently. Therefore, the main surface part and side wall part of the active regions AR1 and AR2 can have approximately the same effective dose, and source/drain regions can also be formed at the side part of the active regions AR1 and AR2, thereby the transistor characteristic can be made stable and uniform.

If required, the source/drain regions may be of LDD (lightly doped drain) structure by performing the following steps. That is, by CVD method, a silicon nitride film having a thickness of 30 nm to 100 nm is deposited on the entire surface so as to cover the gate electrodes 31A and 32A. Then, by anisotropic etching, etch back is performed to form a side wall nitride film (not shown), and impurity ion is further implanted by ion implantation.

Figure 15:
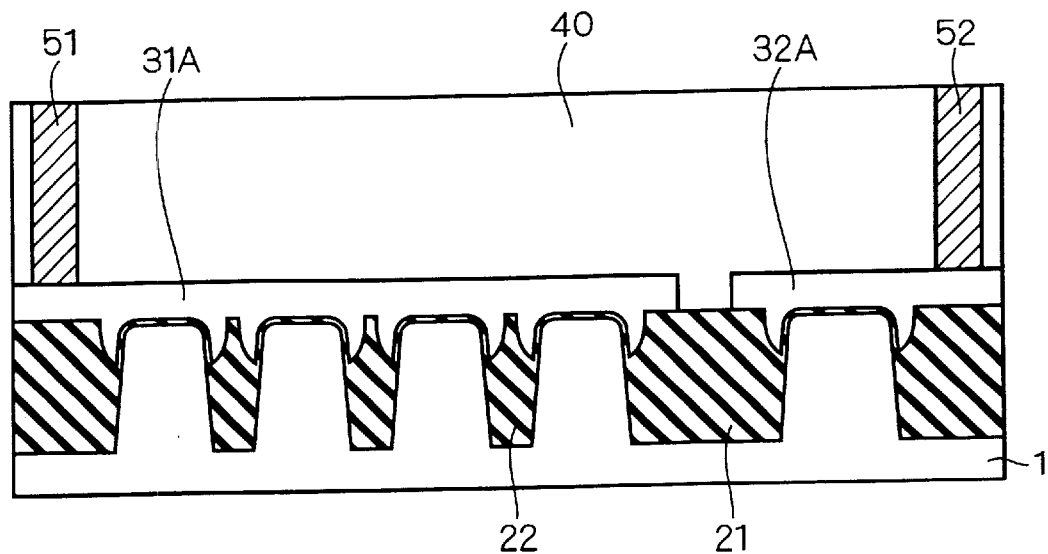

In the step of FIG. 15, a silicon oxide film having a thickness of 300 nm to 800 nm is deposited on the entire surface to form an interlayer insulating film 40. Contact holes extending through the interlayer insulating film 40 to the gate electrode 31A or 32A are opened by using a resist mask (not shown). The contact holes are then buried in such a manner that a tungsten nitride film having a thickness of 20 nm to 100 nm is deposited on the entire surface by means of CVD or sputtering method, and a tungsten film having a thickness of 400 nm to 1000 nm is then deposited on the entire surface by means of CVD or sputtering method. Subsequently, the tungsten film is removed by etching so that the tungsten film is left only in the contact holes, resulting in contact plugs 51 and 52.

Figure 16:
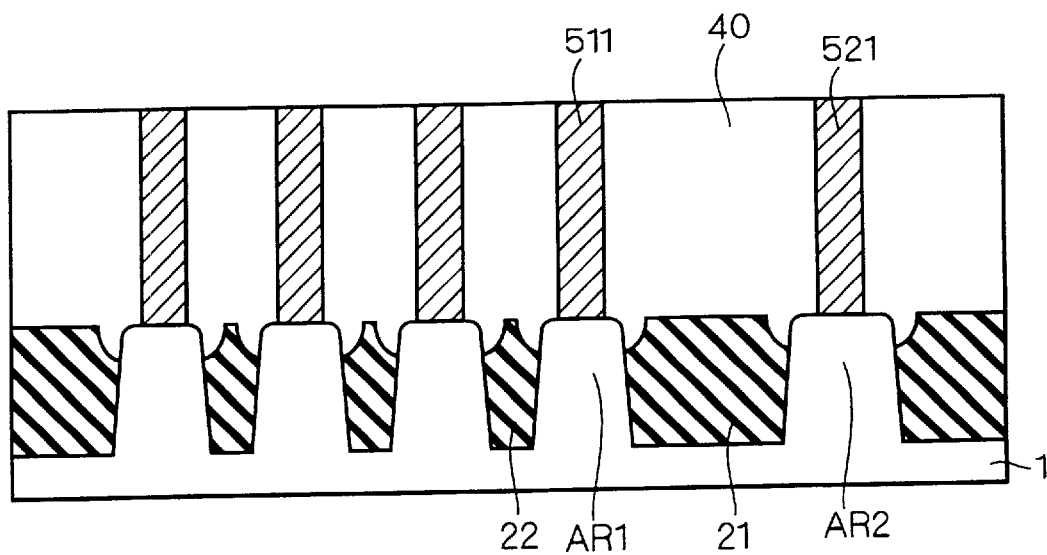
Figure 17:
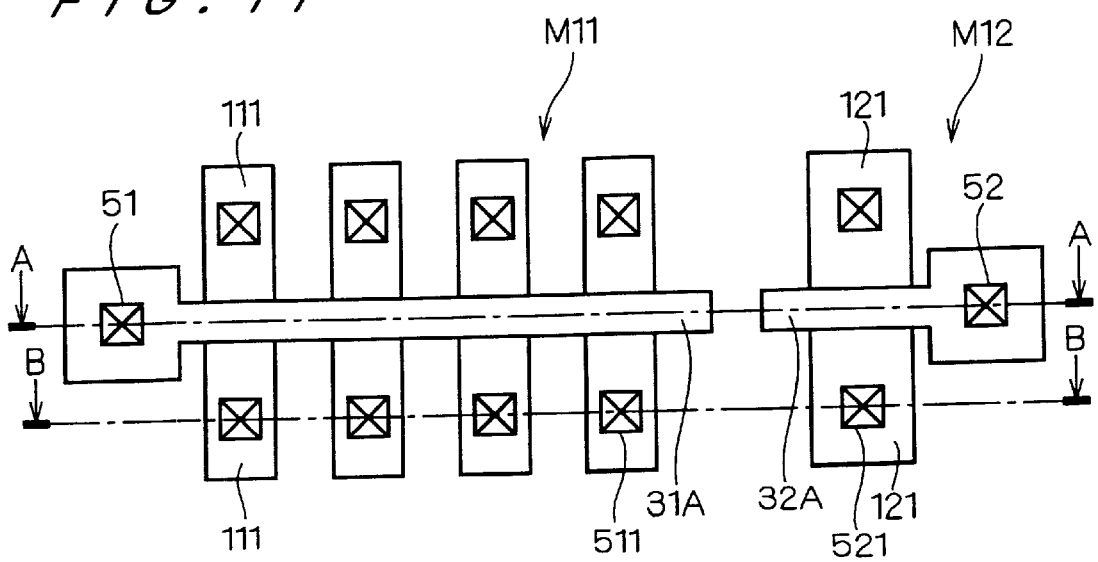
FIG. 17 is a plan view illustrating the construction in the course of manufacturing a semiconductor device according to one preferred embodiment.

FIG. 16 is a cross section taken along line B—B in FIG. 1, illustrating the state that there are provided contact plugs 511 and 521 reaching active regions AR1 and AR2, respectively. The step of forming the contact plugs 511 and 521 is the same as that of the contact plugs 51 and 52. FIG. 17 illustrates, in plan view, the construction after passing through the steps of FIGS. 15 and 16.

Subsequently, a metal material such as aluminum is deposited on the entire surface of the interlayer insulating film 40 and then patterned to form wiring layers 61, 62, 611 and 621, resulting in the construction shown in FIGS. 2 and 3. Further, an interlayer insulating film (not shown) is disposed above the interlayer insulating film 40, and a wiring layer (not shown) is disposed on this interlayer insulating film. Thereby, the wiring layers 61, 62, 611 and 621 are electrically connected to this wiring layer. Such illustration and description are omitted here.

B-2. Step of Forming Groove Portion

Figure 18:
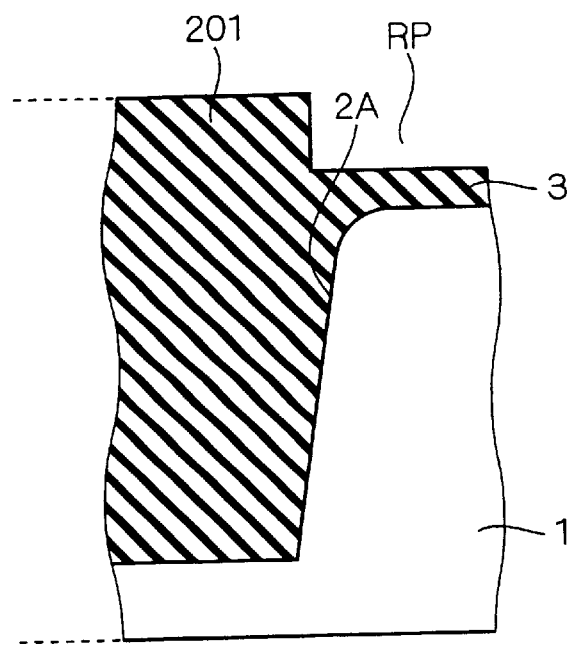
FIGS. 18 to 20 are detail diagrams illustrating a sequence of steps in a method for manufacturing a semiconductor device according to one preferred embodiment.
Figure 19:
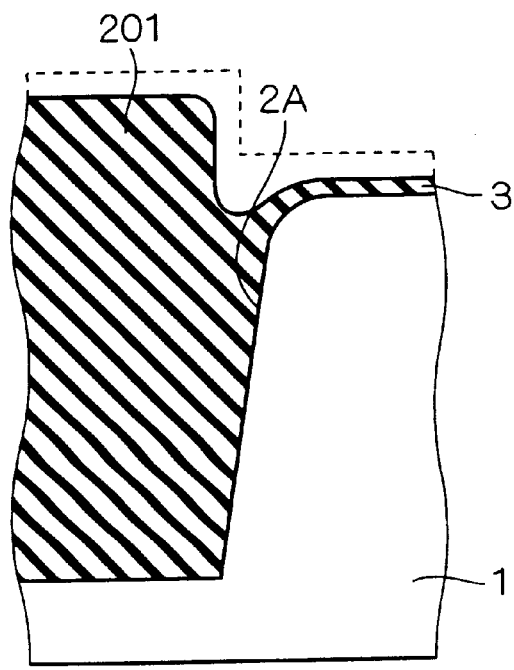
Figure 20:
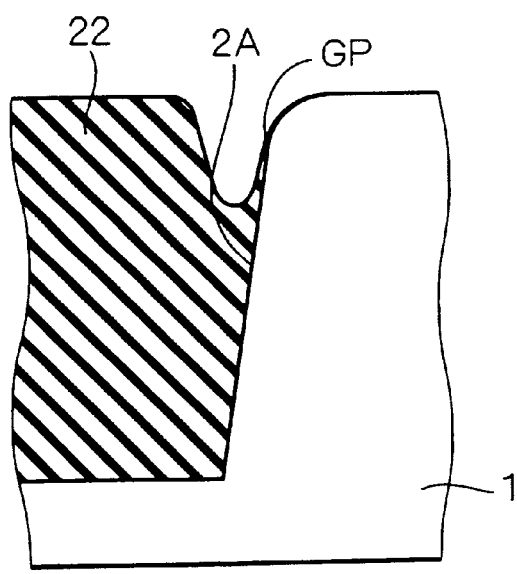

The step of forming a groove portion GP will be further described by referring to FIGS. 18 to 20. FIG. 18 is a fragmentary cross section illustrating the step performed after that described with the aid of FIG. 12, and shows the state that in the vicinity of the edge portion of the trench 2A, the silicon nitride film 4 is removed by wet etching using thermal phosphoric acid.

In FIG. 18, a recess portion RP as being a trace after removing the silicon nitride film 4 is provided in the surface of the silicon oxide film 201. The proper setting of the depth of the recess portion RP (i.e., the thickness of the silicon nitride film 4) effects that the height of the upper main surface of the semiconductor substrate 1 (the upper surface of the active regions AR1 and AR2) is approximately the same as that of the planarized part of the trench isolation oxide films 21 and 22.

FIG. 19 illustrates the state in the course of the step in which the silicon oxide film 3 is removed by wet etching using hydracid fluoride, and the thickness of the silicon oxide film 201 is reduced. Specifically, the bottom corners of the recess portion RP are removed in scrape fashion by performing etching such that the silicon oxide films 3 and 201 are isotropically removed and the silicon oxide film 3 is subjected to over etching.

Referring to FIG. 20, when the isotropic etching is progressed further, the silicon oxide film 3 is completely removed and the thickness of the silicon oxide film 201 is reduced and left as a trench isolation oxide film 22 within the trench 2A. At this time, the edge portion of the trench isolation oxide film 22 is further removed to form the groove portion GP.

In this stage, the upper main surface of the semiconductor substrate 1 (the upper surface of the active regions AR1 and AR2) has approximately the same height as the planarized part of the trench isolation oxide film 22. This is achievable by setting the thickness of the silicon nitride film 4 with consideration as to the etching rate of the silicon oxide films 3 and 201.

For instance, if the thickness of the silicon oxide film 3 is set to 30 nm and that of the silicon nitride film 4 is set to 250 nm, the height of the planarized silicon oxide film 201 from the upper main surface of the semiconductor substrate 1 is 280 nm. In this state, the silicon nitride film 4 is removed and the above-mentioned wet etching is performed such that the silicon oxide film 201 is removed by the amount of a thickness of 280 nm. As a result, the height of the upper main surface of the semiconductor substrate 1 is approximately the same as that of the planarized part of the trench isolation oxide film 22. It is also able to form a groove portion GP that has a depth corresponding to the thickness of the silicon nitride film 4.

Thus, this etching condition determines the magnitude of the groove portion GP, and it follows that the magnitude of the groove portion GP is also considered when setting the thickness of the silicon nitride film 4.

B-3. Step of Rotational Oblique Implantation

Figure 21:
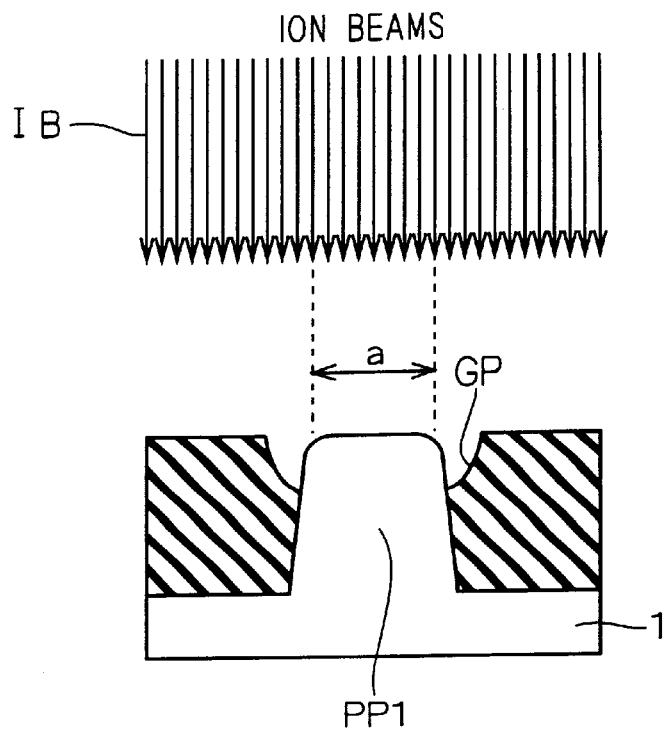
FIGS. 21 and 22 are diagrams illustrating the details of rotational oblique implantation.
Figure 22:
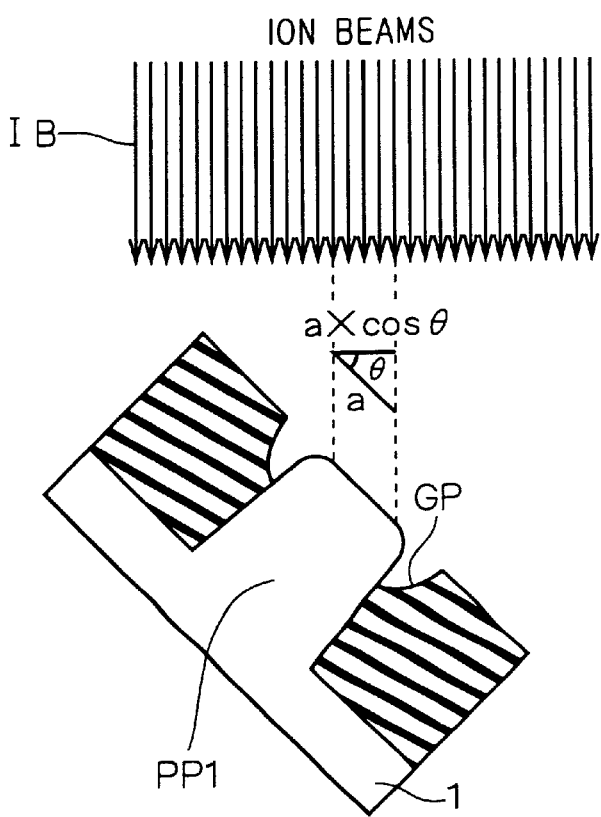

The step of rotational oblique implantation will be described with the aid of FIGS. 21 and 22. This step is essential to realize the construction that the side wall part of the active region is also used as a channel region, as in the semiconductor device according to the present invention. Referring to FIGS. 21 and 22, this step will be described hereinafter by taking the step of well implantation or channel implantation as example.

FIG. 21 illustrates schematically the state that ion beams IB enter vertically to the semiconductor substrate 1 in which the groove portion GP is provided after passing through the step described with the aid of FIG. 13.

In FIG. 21, there are shown a projected region PP1 and its surroundings, and "a" denotes the width dimension of the planarized part of the projected region PP1. As illustrated, when ion implantation is performed without inclining the semiconductor substrate 1, the ion implantation is hardly applied to the side wall part of the projected region PP1 formed at an angle of nearly a right angle.

In contrast, as shown in FIG. 22, when ion beams IB are irradiated by inclining the semiconductor substrate 1 in which the groove portion GP is provided after passing through the step of FIG. 13, at an angle θ (0°<θ<90°) with respect to the direction in which the ion beams IB enter, the dose to the planarized part of the projected portion is reduced by the amount of COS θ (COS θ<1) times than that in the case of implanting without inclining the semiconductor substrate 1. This however results in that ion is implanted to one side part of the projected region PP1.

Note that a predetermined amount of dose to the planarized part of the projected region PP1 cannot be obtained by only one ion implantation, thus it is required to perform a number of ion implantations intermittently. The number of ion implantations depends on the angle of inclination (the angle of implantation). The angle of inclination (i.e., the angle of implantation) is set to satisfy the relationship of N=1/COS θ wherein N is the number of ion implantations. For instance, when the angle of implantation is 75.5°, the number of ion implantations is four.

Here, a standard implantation is defined as implantation under the same condition (dose) as in the ion implantation without inclining the semiconductor substrate 1. To perform ion implantation a number of times intermittently indicates that the standard implantation is performed each time the semiconductor substrate 1 is rotated in the plane a predetermined rotation angle and the number of times obtained according to the angle of inclination of the semiconductor substrate 1.

For instance, when the number of ion implantations is three, the standard implantation is performed each time the inclined semiconductor substrate 1 is rotated 120° in the plane.

The rotational oblique implantation can be adopted for source/drain implantation in a similar manner, and it is able to form source/drain regions at the side part of the active regions AR1 and AR2.

B-4. Step of Forming Round Portion

In the step described with the aid of FIG. 11, the upper edge portions of the projected regions PP1 and PP2 have a round shape by subjecting the inner walls of the trenches 2 and 2A to thermal oxidation thereby to cover with the silicon oxide film 10 having a thickness of 10 nm to 30 nm. This thermal oxidation is preferably high temperature thermal oxidation conducted at a temperature of 1000 to 1200° C. in a dry oxygen atmosphere.

Figure 23:
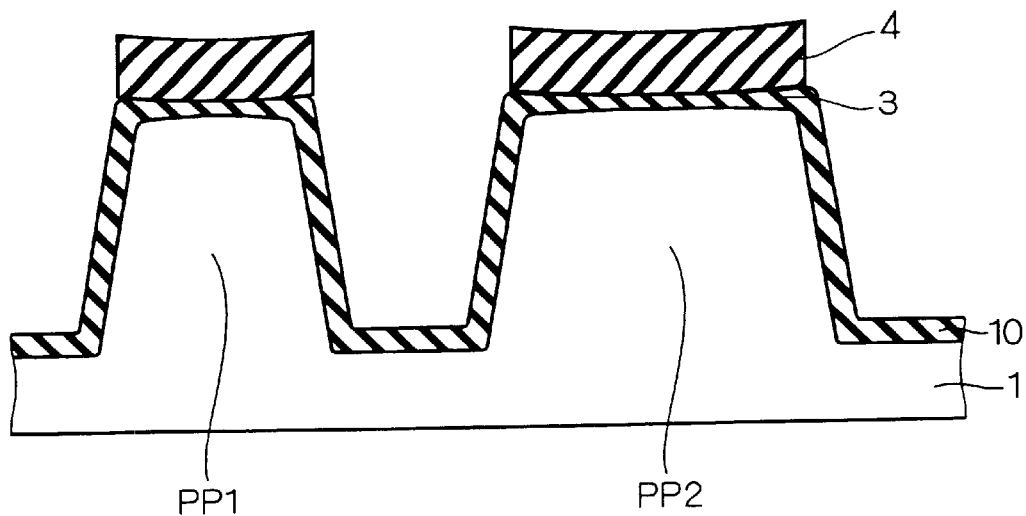
FIGS. 23 and 24 are diagrams illustrating the step of forming a round portion.
Figure 24:
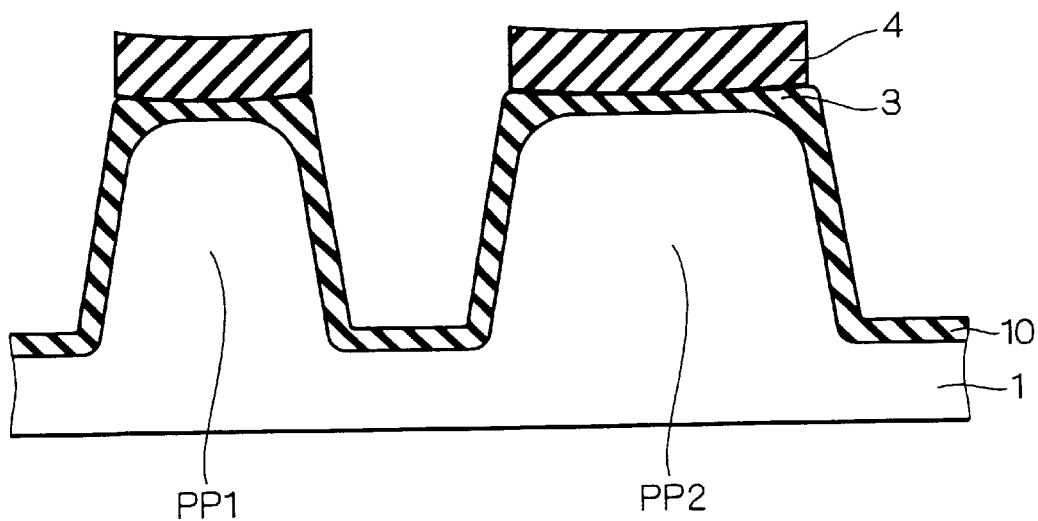

FIG. 23 illustrates the state that the silicon oxide film 10 is formed at a relatively low temperature of 700 to 950° C. FIG. 24 illustrates the state that the silicon oxide film 10 is formed by high temperature thermal oxidation. As can be seen from FIGS. 23 and 24, the upper edge portions of the projected regions PP1 and PP2 have a small radius of curvature when the oxidation temperature is low, whereas their radius of curvature is enlarged in the case of high temperature thermal oxidation.

Specifically, when the oxidation temperature is low, a long bird's beak is formed between the silicon oxide film 3 and the projected region PP1 or PP2, and the planarized part is more susceptible to oxidation than the upper edge portions of the projected regions PP1 and PP2, and the radius of curvature of the upper edge portions is not enlarged. On the other hand, in the high temperature thermal oxidation, no bird's beak extends toward the center of the projected regions PP1 and PP2, and there is formed a short bird's beak that oxidizes mainly the upper edge portions of the projected regions PP1 and PP2, thus making it possible to increase the radius of curvature of the upper edge portions.

Note that the high temperature thermal oxidation may be performed in an oxygen atmosphere containing hydrogen or a vapor atmosphere, instead of a dry oxygen atmosphere.

Alternatively, the upper edge portions of the projected regions PP1 and PP2 may be formed into a round shape by performing, prior to the formation of the silicon oxide film 10, annealing in a hydrogen atmosphere of 850 to 1000° C., in order to cause migration of silicon atoms (which then causes rearrangement).

C. Resulting Effects

As above described, the semiconductor device 100 of the present invention is such that the side wall part of the active regions AR1 and AR2 is also used as a channel region, because the groove portion GP is disposed at the boundary part between the trench isolation oxide film 22 or 21 surrounding the active region AR1 or AR2 and the active region AR1 or AR2, and the gate electrodes 31A and 32A are provided so as to be buried in the groove portion GP with the gate oxide film 30 interposed therebetween. Therefore, the current driving capability of the MOS transistor can be increased without increasing the gate width. This permits the semiconductor device that can obtain more output current without increasing the occupied area of the MOS transistor. In addition, there are the following advantages.

Firstly, since the groove portion GP is locally provided at the boundary part between the trench isolation oxide film 22 or 21 and the active region AR1 or AR2, the surface of the gate electrode 31A or 32A provided thereon can be planarized and the dimensional accuracy at the time of photolithography can be increased, resulting in the MOS transistor causing less variations in transistor characteristic.

Secondly, in the MOS transistor M11 having the relatively large active region, by providing a plurality of active regions ARI defined by the trench isolation oxide film 22 and by disposing the groove portion therearound, the effective channel region width can be further increased and the current driving capability is thus increased to permit higher speed operation.

Thirdly, since the current driving capability per unit area is increased, the MOS transistor can be further minimized and the chip size can be reduced.

Fourthly, since the upper edge portions of the active regions AR1 and AR2 are rounded by increasing their radius of curvature, it is able to prevent the reverse narrow channel effect caused by the fringing field from the gate electrodes 31A and 32A.

D. Modifications

The semiconductor device 100 of the invention shown in FIGS. 1 to 3 is constructed such that the MOS transistor M11 has a plurality of source/drain regions 111 which are arranged in pairs in the semiconductor substrate surface located outside of the transversely opposite sides of the gate electrode 31A, and the adjacent source/drain regions 111 in the direction of extension of the gate electrode 31A are divided by the trench isolation oxide film. Like a MOS transistor M11A of a semiconductor device 100A shown in FIG. 25, it may be so arranged that a pair of source/drain regions 11A is provided outside of the sides of the gate electrode 31A, and a plurality of trench isolation oxide films 22A (local insulating films) are locally disposed under the gate electrode 31A along the gate electrode 31A.

Figure 25:
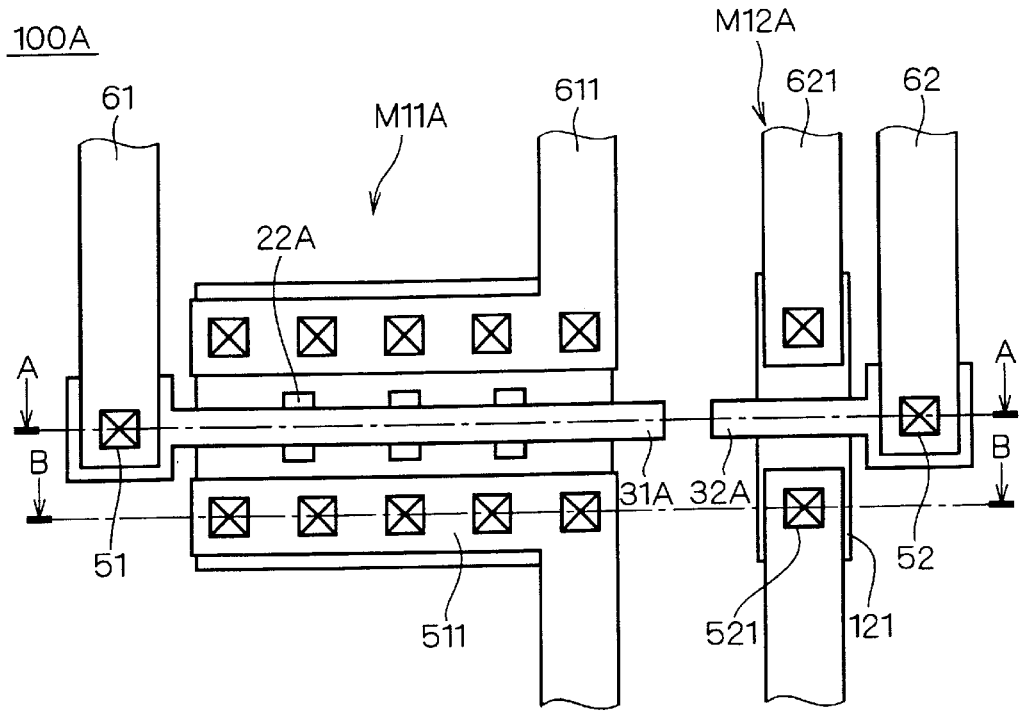
FIG. 25 is a plan view illustrating the construction of a modification of a semiconductor device according to one preferred embodiment.

That is, as shown in FIG. 25, the trench isolation oxide film 22A is provided at predetermined spaced intervals along the gate electrode 31A, and is in the shape of rectangle. The trench isolation oxide film 22A is disposed so that its longitudinal magnitude is slightly longer than the gate length of the gate electrode 31A, and the longitudinal direction of the trench isolation oxide film 22A crosses the transverse direction of the gate electrode 31A at right angles.

The gate electrode 31A is disposed above the array of the trench isolation oxide films 22A. The constructions in cross section taken along line A—A and line B—B in FIG. 25 are illustrated in FIG. 26 and FIG. 27, respectively.

Figure 26:
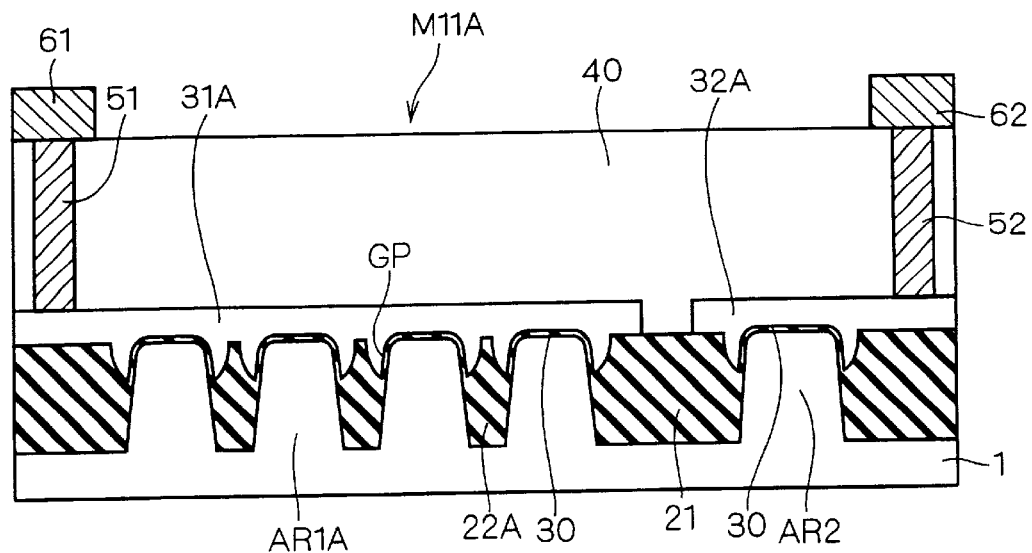
FIGS. 26 and 27 are cross sections illustrating the construction of a modification of a semiconductor device according to one preferred embodiment.

The construction in cross section shown in FIG. 26 is the same as that of the semiconductor device 100 described with the aid of FIG. 2. At the boundary part between the trench isolation oxide film 22A and an active region AR1A, there is provided a groove portion GP so as to surround the active region AR1A. The groove portion GP has an opening in which the width of the top is 20 nm to 80 nm and the depth is 50 nm to 150 nm.

The groove portion GP is disposed not only in the surface of the trench isolation oxide film 22A but also at the boundary part between the trench isolation film 21 and the active region AR1A.

Figure 27:
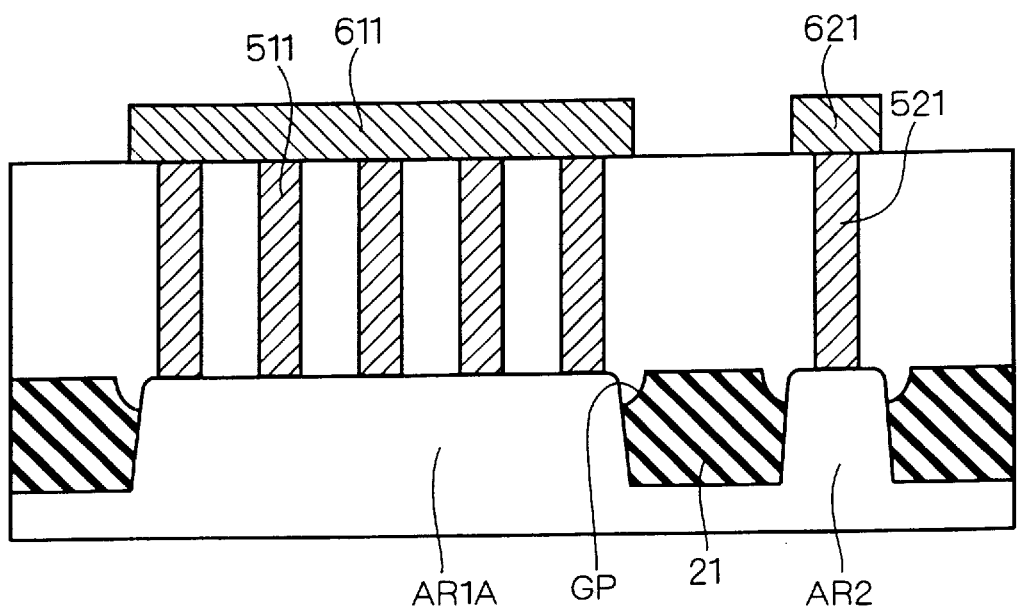

The construction in cross section shown in FIG. 27 is slightly different from that of the semiconductor device 100 described with the aid of FIG. 3. That is, the active region AR1A at the segment shown in FIG. 27 is not divided but of unitary configuration.

Thus, the construction of the semiconductor device 100A is the same as that of the semiconductor device 100 except that the active region AR1A has the part in the form of divided pieces and the part of unitary configuration. Therefore, the same reference numerals have been used for similar components and description thereof is omitted here.

Note that the trench isolation oxide film 22A does not exactly function as an isolation oxide film and is one in which only an insulating film for forming the groove portion GP is locally provided. The reason why the trench isolation oxide film 22A is so called is because it can be formed at the same step for forming the trench isolation oxide film 21 and has the same cross-sectional shape as the film 21.

Of course, the semiconductor device 100A has the same resulting effects as the semiconductor device 100. Since the active region AR1A is divided only in the vicinity of the gate electrode, the source/drain regions 11A is wide to provide a large degree of freedom of contact hole arrangement to the source/drain regions 11A. This increases the design margin and thus permits a further reduction in chip size.

E. Consideration of Conventional Techniques

It is one feature of the present invention to increase the current driving capability of the MOS transistor without increasing the gate width, by using the side wall part of the active region as a channel region. One example of using an active region in three dimensions is disclosed in Japanese Patent Application Laid-Open No. 5-299497 (1993).

Figure 28:
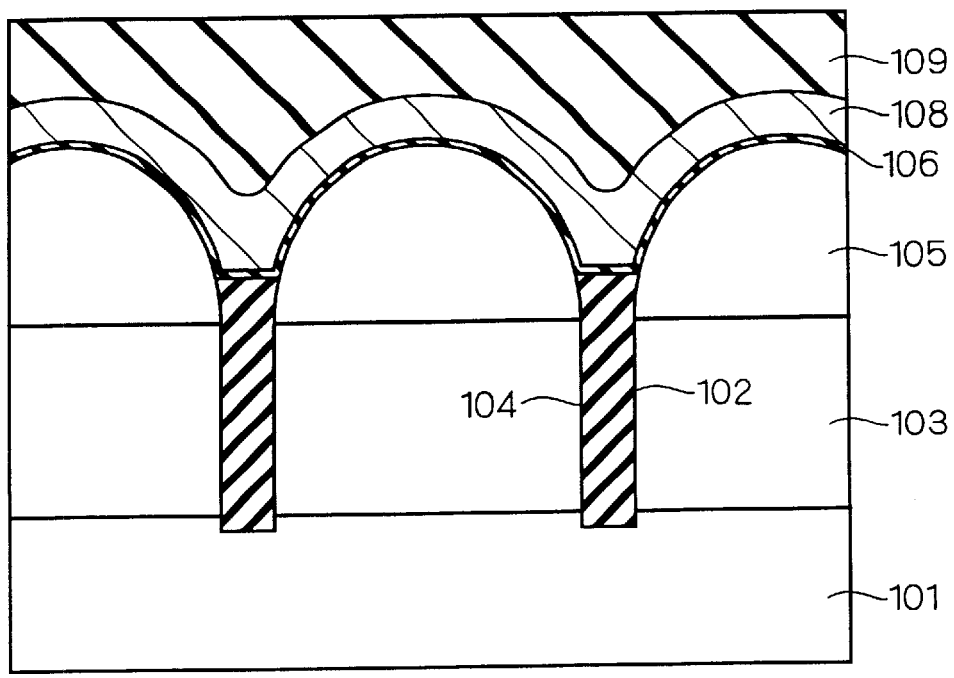
FIG. 28 is a cross section illustrating the construction of a conventional semiconductor device.

Specifically, as shown in FIG. 28, the construction disclosed in this publication is such that on a semiconductor substrate 101, a plurality of source/drain parts 105 having a greatly curved cross-sectional shape are disposed and electrically isolated by a trench part 104 disposed therebetween.

In this publication, a gate electrode 108 is disposed along the contour of each source/drain part 105, and the gate electrode 108 is of a corrugated configuration. This construction is, however, unsuitable for the trend in modern technique that as miniaturization is proceeded, the depth of focus is shallower in photolithography for forming a gate electrode.

Further in this publication, a gate oxide film 106 is provided so as to cover the source/drain parts 105, and the gate electrode 108 is disposed on the gate oxide film 106. Thus, the channel region of the source/drain parts 105 seems to be larger than would be the case of the planarized source/drain parts 105. However, the object of the invention of this publication is to lower the contact resistance and reduce leakage current at the edge portion of the trench in the following manner that the surface of the source/drain parts 105 is allowed to have a curvature to increase the contact area and also to reduce subthreshold swing (S-FACTOR) by the curvature of the source/drain parts 105. That is, there are no disclosure and suggestion as to the technical idea of widening the channel region by curving the source/drain parts 105.

While the invention has been shown and described in detail, the foregoing description is in all aspects illustrative and not restrictive. It is therefore understood that numerous modifications and variations can be devised without departing from the scope of the invention.

What is claimed is:

1. A semiconductor device comprising:
   a semiconductor substrate;
   a MOS transistor disposed on said semiconductor substrate; and
   an element isolation insulating film for electrically isolating said MOS transistor from other semiconductor elements, disposed in a main surface of said semiconductor substrate,
   wherein said MOS transistor comprises a gate insulating film disposed on at least one active region defined as a region of said semiconductor substrate surrounded by said element isolation insulating film, and a gate electrode disposed on said gate insulating film,
   said element isolation insulating film has a groove portion disposed at the part bounded by said at least one active region,
   the side wall surface of said at least one active region is exposed in said groove portion, and
   said gate electrode is also disposed in said groove portion with said gate insulating film interposed therebewteen.

2. The semiconductor device according to claim 1 wherein
   said at least one active region is a plurality of active regions arranged at spaced intervals along the direction in which said gate electrode extends, said active regions being electrically isolated from each other by said element isolation insulating film, and
   said groove portion is also disposed in said element isolation insulating film for isolating said active regions.

3. The semiconductor device according to claim 2 wherein
   in the opening of said groove portion, the depth dimension along said side wall surface is greater than the width dimension of the top.

4. The semiconductor device according to claim 1, further comprising:
   at least one local insulating film disposed in the surface of said semiconductor substrate underlying said gate electrode in said at least one active region,
   wherein said at least one local insulating film has a groove portion disposed at the part bounded by said at least one active region around said local insulating film, and
   the side wall surface of said at least one active region is exposed in said groove portion.

5. The semiconductor device according to claim 4 wherein
   in the opening of said groove portion, the depth dimension along said side wall surface is greater than the width dimension of the top.

6. The semiconductor device according to claim 5 wherein
   the cross-sectional shape of the upper edge portion of said at least one active region is in a circular arc.

7. The semiconductor device according to claim 2 wherein
   in said element isolation insulating film for isolating said active regions, the width dimension along the direction of extension of said gate electrode is smaller than twice the depth dimension along said side wall surface of said groove portion.

8. The semiconductor device according to claim 4 wherein
   in said local insulating film, the width dimension along the direction of extension of said gate electrode is smaller than twice the depth dimension along said side wall surface of said groove portion.

* * * * *